(12) United States Patent
Kim et al.

(10) Patent No.: US 12,532,460 B2
(45) Date of Patent: Jan. 20, 2026

(54) SEMICONDUCTOR MEMORY DEVICE

(71) Applicant: Samsung Electronics Co., Ltd., Suwon-si (KR)

(72) Inventors: Jin A Kim, Suwon-si (KR); Kang-Uk Kim, Suwon-si (KR); Sang Hoon Min, Suwon-si (KR); Choong Hyun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 375 days.

(21) Appl. No.: 18/352,528

(22) Filed: Jul. 14, 2023

(65) Prior Publication Data

US 2024/0107751 A1   Mar. 28, 2024

(30) Foreign Application Priority Data

Sep. 23, 2022   (KR) .................. 10-2022-0120712

(51) Int. Cl.
*H10B 12/00*       (2023.01)

(52) U.S. Cl.
CPC ......... *H10B 12/485* (2023.02); *H10B 12/312* (2023.02); *H10B 12/482* (2023.02); *H10B 12/488* (2023.02)

(58) Field of Classification Search
CPC .. H10B 12/485; H10B 12/312; H10B 12/482; H10B 12/488; H10B 12/0335; H10B 12/315; H10B 12/09; H10B 12/34; H10B 12/48; H10B 12/50

See application file for complete search history.

(56) References Cited

U.S. PATENT DOCUMENTS

| | | |
|---|---|---|
| 8,648,423 B2 | 2/2014 | Han et al. |
| 10,020,253 B2 | 7/2018 | Lee |
| 10,269,808 B2 | 4/2019 | Kim et al. |
| 10,453,849 B2 | 10/2019 | Liou et al. |
| 10,910,363 B2 | 2/2021 | Lee et al. |
| 11,139,306 B2 | 10/2021 | Ikeda |
| 2012/0214297 A1 | 8/2012 | Cho et al. |
| 2014/0008719 A1* | 1/2014 | Jeong ................ G11C 16/0466 257/330 |

FOREIGN PATENT DOCUMENTS

| | | |
|---|---|---|
| JP | 2014-056862 A | 3/2014 |
| KR | 10-2011-0078132 A | 7/2011 |
| KR | 10-2011-0092514 A | 8/2011 |

* cited by examiner

*Primary Examiner* — Mohammed R Alam
(74) *Attorney, Agent, or Firm* — Harness, Dickey & Pierce, P.L.C.

(57) ABSTRACT

A semiconductor memory device is provided. The semiconductor memory device comprises a substrate including a cell region having an active region defined by a cell element isolation layer, a peripheral region near the cell region, and a boundary region between the cell region and the peripheral region. The device includes a word line structure in the substrate and extending in a first direction, a bit line structure on the substrate extending from the cell region to the boundary region in a second direction that crosses the first direction, including first and second cell conductive layers sequentially stacked on the substrate, and a bit line contact between the substrate and the bit line structure and connecting the substrate with the bit line structure. The second cell conductive layer in the boundary region is thicker than the second cell conductive layer in the cell region.

20 Claims, 37 Drawing Sheets

SEMICONDUCTOR MEMORY DEVICE

CROSS-REFERENCE TO RELATED APPLICATION

This application claims priority from Korean Patent Application No. 10-2022-0120712 filed on Sep. 23, 2022 in the Korean Intellectual Property Office and all the benefits accruing therefrom under 35 U.S.C. 119, the contents of which in its entirety are herein incorporated by reference.

BACKGROUND

Various example embodiments relate to a semiconductor memory device.

As semiconductor devices become increasingly highly integrated, individual circuit patterns are becoming finer so as to implement more semiconductor devices in the same area. That is, with the increase in the degree of integration of the semiconductor device, the design rule for components of the semiconductor device has been reduced.

In highly scaled semiconductor devices, a process of forming a plurality of wiring lines and a plurality of contacts interposed between the wiring lines has become increasingly complex and difficult.

SUMMARY

Various example embodiments provide a semiconductor memory device that may improve reliability and/or performance.

Various objects and/or improvements of example embodiments are not limited to those mentioned above and additional features, which are not mentioned herein, will be clearly understood by those of ordinary skill in the art from the following description.

A semiconductor memory device according to some example embodiments comprises a substrate including a cell region having an active region defined by a cell element isolation layer, a peripheral region near the cell region, and a boundary region between the cell region and the peripheral region, a word line structure extending in the substrate in a first direction, a bit line structure extending on the substrate from the cell region to the boundary region in a second direction that crosses the first direction, including first and second cell conductive layers sequentially stacked on the substrate, and a bit line contact between the substrate and the bit line structure and connecting the substrate with the bit line structure. The second cell conductive layer in the boundary region is thicker than the second cell conductive layer in the cell region.

Alternatively or additionally, a semiconductor memory device according to various example embodiments comprises a substrate including a cell region having an active region defined by a cell element isolation layer, a peripheral region near the cell region, and a boundary region between the cell region and the peripheral region, a word line structure extending in the substrate in a first direction, a bit line structure extending on the substrate from the cell region to the boundary region on the substrate in a second direction that crosses the first direction, including first and second cell conductive layers sequentially stacked in a direction away from the substrate, and a bit line contact between the substrate and the bit line structure and electrically connecting the substrate with the bit line structure. An upper surface of the first cell conductive layer in the boundary region is lower than that of the first cell conductive layer in the cell region, and a length along the first direction of the second cell conductive layer in the boundary region is longer than a length along the first direction of the second cell conductive layer in the cell region.

Alternatively or additionally, a semiconductor memory device according to various example embodiments comprises a substrate including a cell region having an active region defined by a cell element isolation layer, a peripheral region near the cell region, and a boundary region between the cell region and the peripheral region, a word line structure extending in the substrate in a first direction in the substrate, a bit line structure extending on the substrate from the cell region to the boundary region in a second direction that crosses the first direction, including first to third cell conductive layers sequentially stacked on the substrate, and a bit line contact between the substrate and the bit line structure and electrically connecting the substrate with the bit line structure. An upper surface of the bit line contact is lower than an upper surface of the first cell conductive layer in the cell region and is higher than an upper surface of the first cell conductive layer in the boundary region, and the third cell conductive layer on the bit line contact is thicker than the third cell conductive layer on the first cell conductive layer in the cell region and is thinner than the third cell conductive layer in the boundary region.

These and other details of the additional and/or other example embodiments are included in the detailed description and drawings.

BRIEF DESCRIPTION OF THE DRAWINGS

The above and other aspects and features will become more apparent by describing in detail exemplary embodiments thereof with reference to the attached drawings, in which.

DETAILED DESCRIPTION

Figure 1:
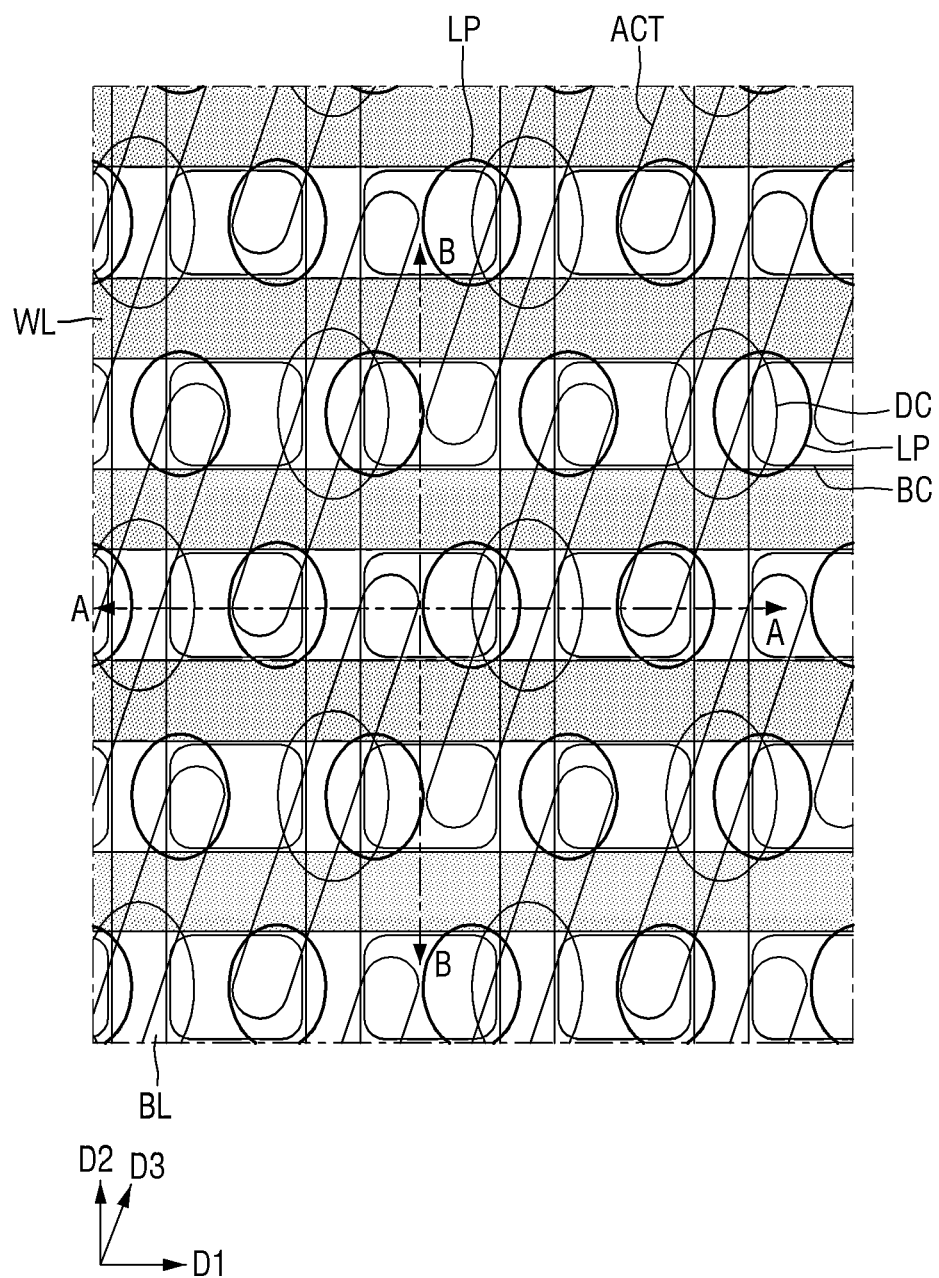
FIG. 1 is a schematic layout view illustrating a cell region of a semiconductor memory device according to some example embodiments.
Figure 2:
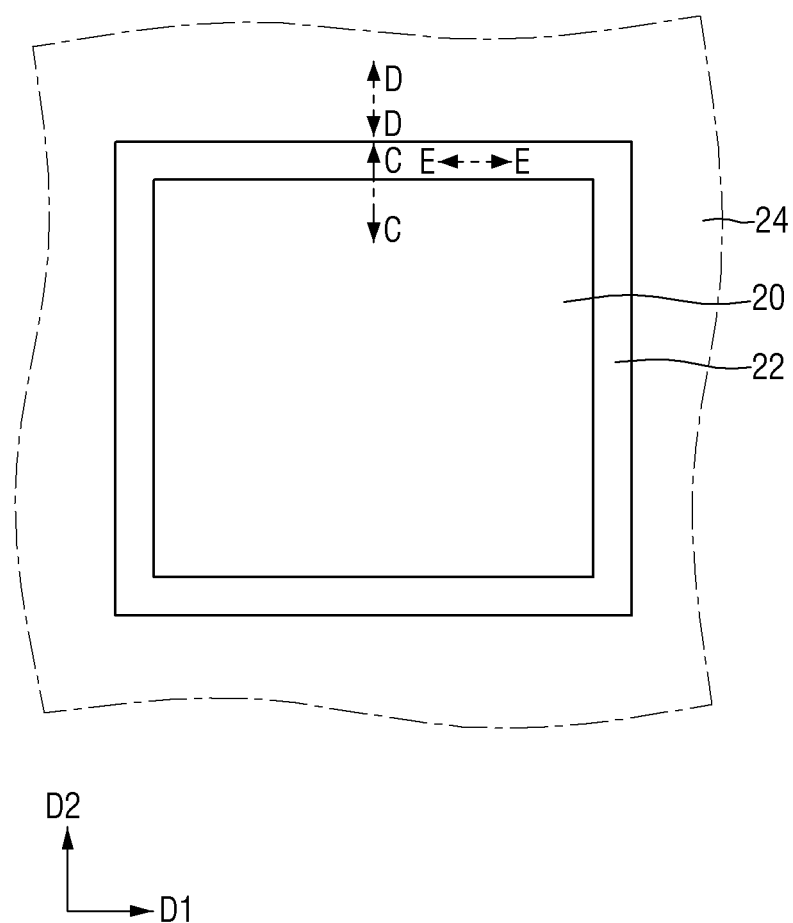
FIG. 2 is a schematic layout view illustrating a semiconductor memory device that includes the cell region of FIG. 1.
Figure 3:
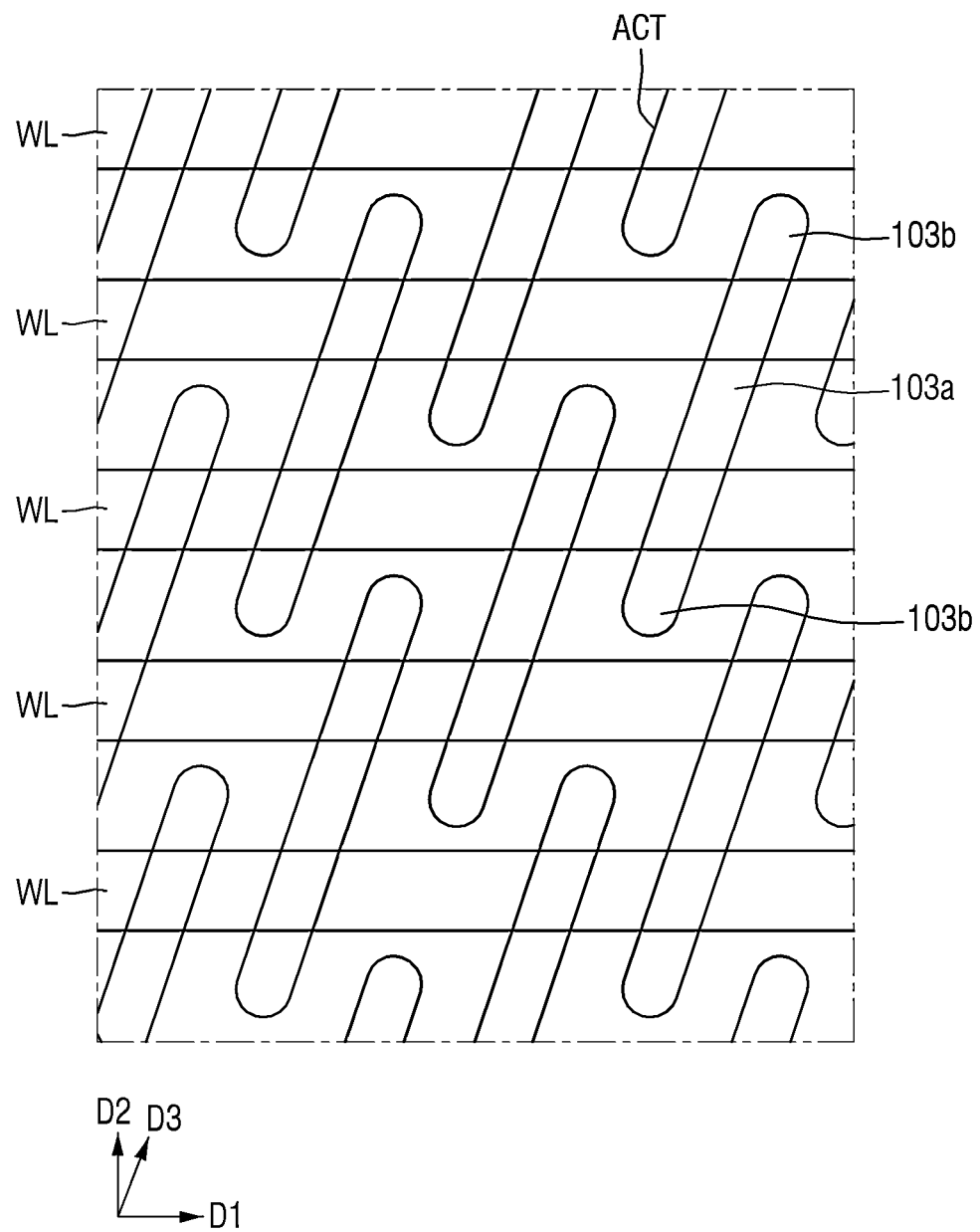
FIG. 3 is a layout illustrating a word line and an active region of FIG. 1.
Figure 4:
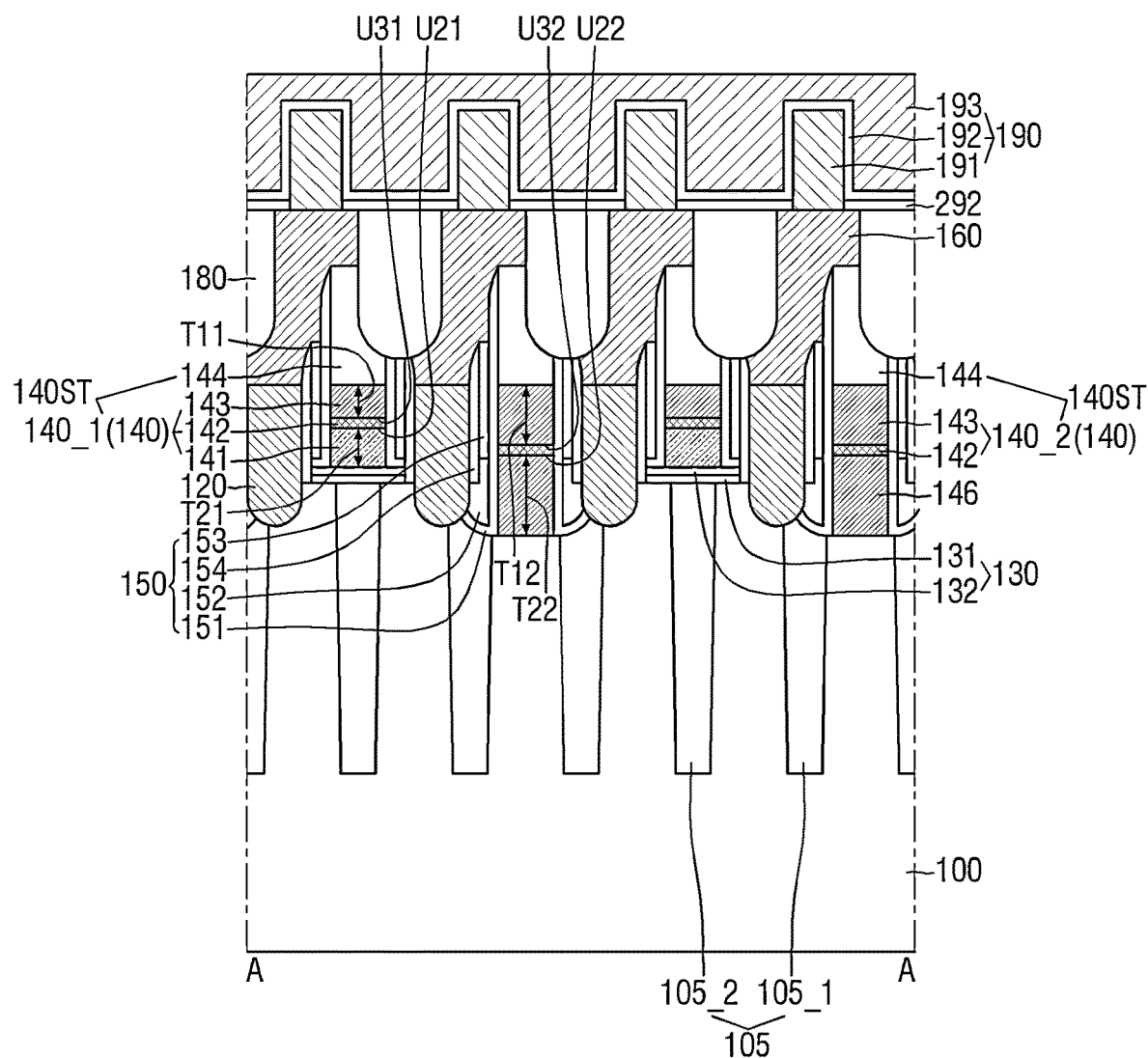
FIGS. 4 and 5 are cross-sectional view taken along line A-A and line B-B of FIG. 1.
Figure 5:
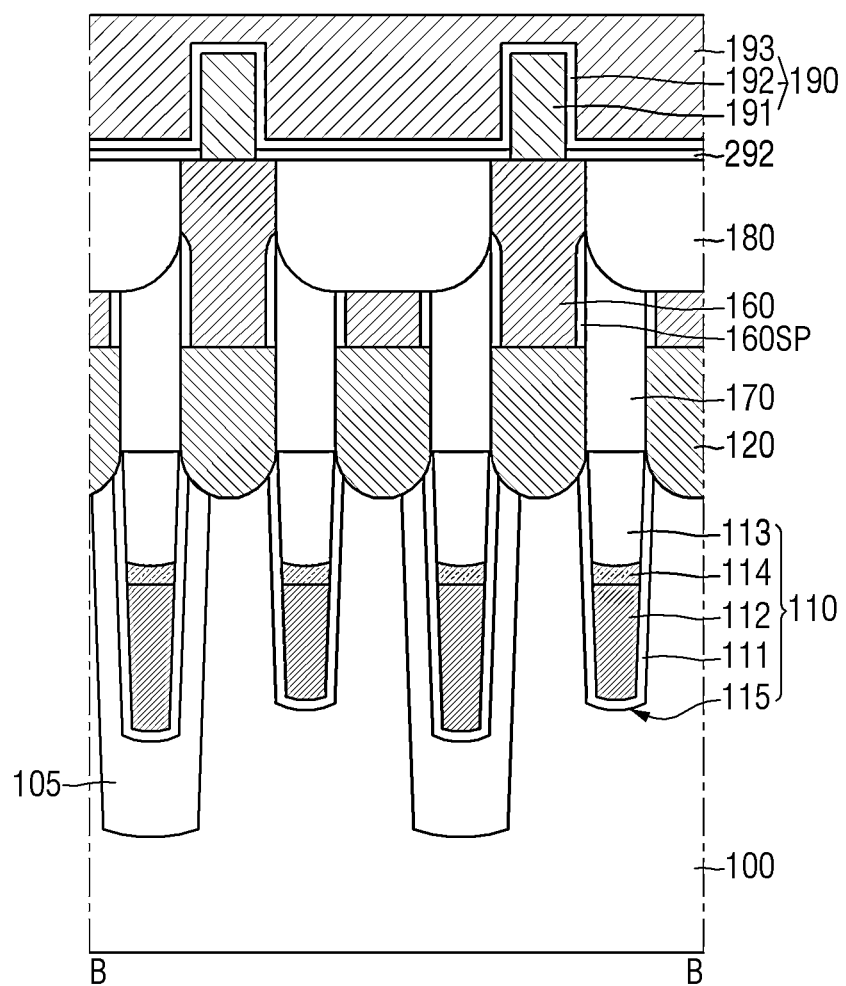
Figure 6:
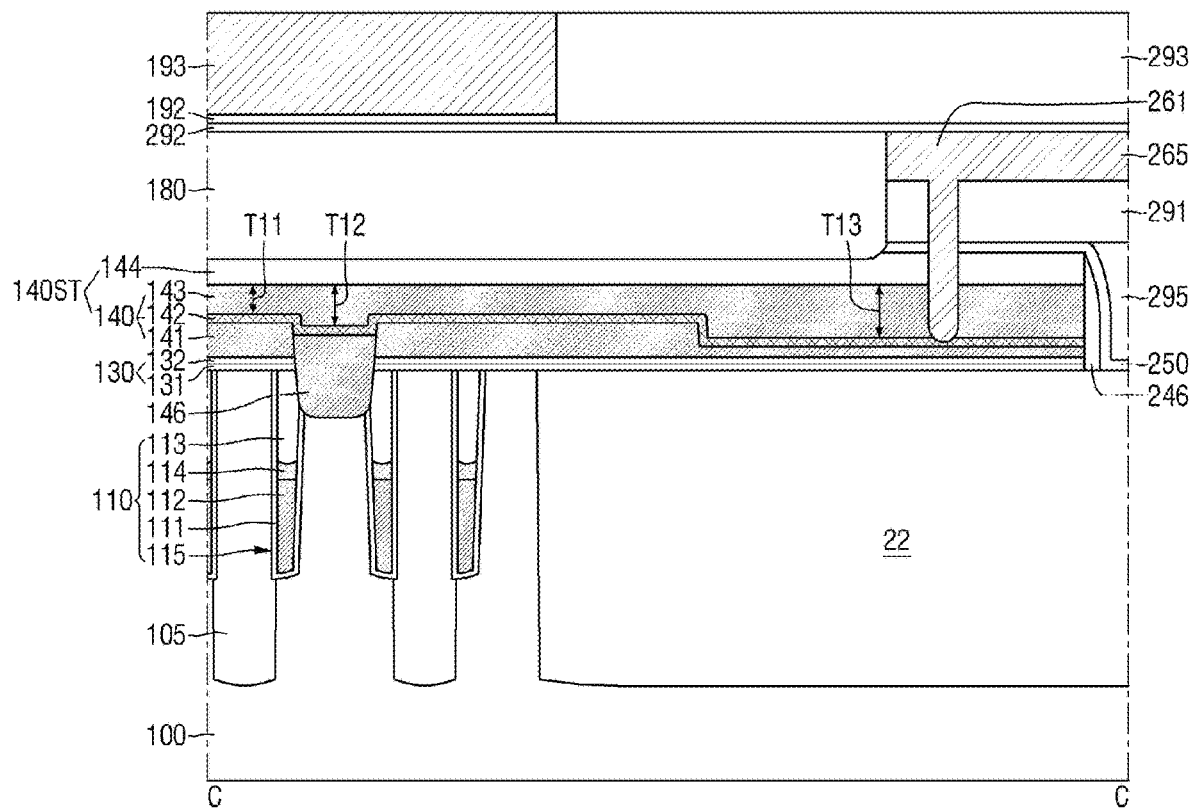
FIG. 6 is a cross-sectional view taken along line C-C of FIG. 2.
Figure 7:
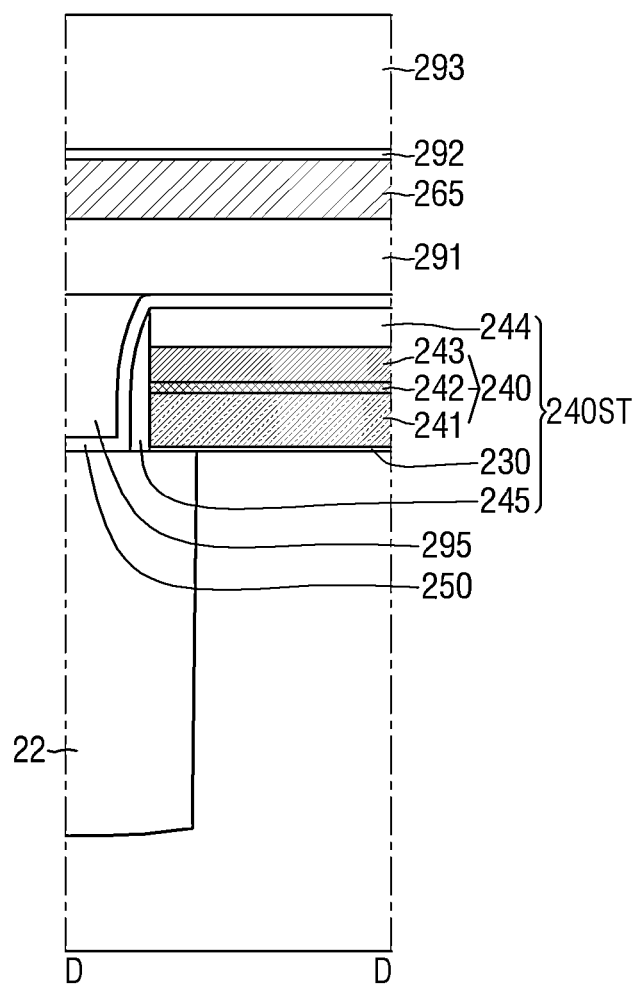
FIG. 7 is a cross-sectional view taken along line D-D of FIG. 2.
Figure 8:
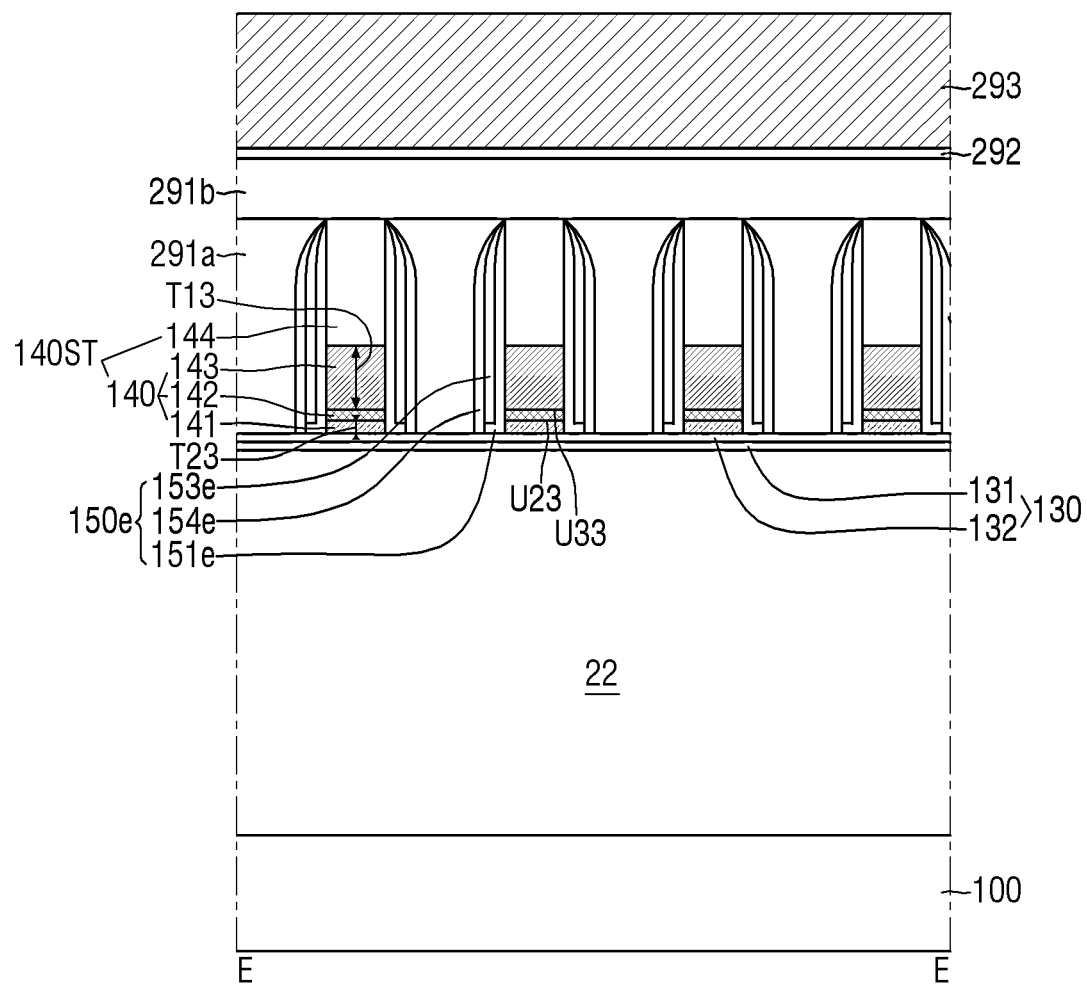
FIG. 8 is a cross-sectional view taken along line E-E of FIG. 2.

FIG. 1 is a schematic layout view illustrating a cell region of a semiconductor memory device according to some example embodiments. FIG. 2 is a schematic layout view illustrating a semiconductor memory device that includes the cell region of FIG. 1. FIG. 3 is a layout illustrating a word line and an active region of FIG. 1. FIGS. 4 and 5 are cross-sectional view taken along line A-A and line B-B of FIG. 1. FIG. 6 is a cross-sectional view taken along line C-C of FIG. 2. FIG. 7 is a cross-sectional view taken along line D-D of FIG. 2. FIG. 8 is a cross-sectional view taken along line E-E of FIG. 2.

For reference, FIG. 6 may be a cross-sectional view taken along a bit line BL of FIG. 1 in a cell region isolation layer 22.

Although a dynamic random access memory (DRAM) is shown in the drawing related to a semiconductor memory device according to some example embodiments by way of example, example embodiments are not limited thereto, and other embodiments may include other devices such as but not limited to non-volatile memory devices.

Referring to FIGS. 1 to 3, the semiconductor memory device according to some example embodiments may include a cell region 20, a cell region isolation layer 22 and a peripheral region 24.

The cell region isolation layer 22 may be formed or arranged along the periphery of the cell region 20. The cell region isolation layer 22 may isolate the cell region 20 from the peripheral region 24. The peripheral region 24 may be defined near the cell region 20. In some example embodiments, a region between the cell region 20, in which the cell region isolation layer 22 is formed, and the peripheral region 24 may be referred to as a boundary region.

The cell region 20 may include a plurality of cell active regions ACT, e.g. a plurality of islands corresponding to cell active regions ACT. The cell active region ACT may be defined by a cell element isolation layer (105 of FIG. 4) formed in a substrate (100 of FIG. 4). As a design rule of the semiconductor memory device is reduced, the cell active region ACT may be disposed in a bar shape of a diagonal line and/or an oblique line. For example, the cell active region ACT may be extended in a third direction D3.

A plurality of gate electrodes may be disposed in a first direction D1 across the cell active region ACT. The first direction D1 may be at an angle such as an oblique angle with the third direction D3. The plurality of gate electrodes may be extended in parallel with each other. The plurality of gate electrodes may be, for example, a plurality of row lines or word lines WL. The word lines WL may be disposed at constant intervals, e.g. at a particular pitch. A width of the word line WL and/or a spacing or a pitch or an interval between the word lines WL may be determined in accordance with the design rule.

Each cell active region ACT may be divided into three portions by two word lines WL extending in the first direction D1. The cell active region ACT may include a storage connection region 103b and a bit line connection region 103a. The bit line connection region 103a may be positioned at or near a center portion of the cell active region ACT, and the storage connection region 103b may be positioned at the end of the cell active region ACT.

A plurality of column lines or bit lines BL extended in a second direction D2 orthogonal to the word line WL may be disposed on the word line WL. The second direction D2 may be perpendicular to the first direction D1 and at an acute angle, e.g. at an angle less than 45 degrees, with respect to the third direction D3. The plurality of bit lines BL may be extended in parallel with each other. The bit lines BL may be disposed at constant intervals. A width of the bit line BL and/or a spacing or a pitch or an interval between the word lines BL may be determined in accordance with the design rule. The number of bit lines BL may be the same as, greater than, or less than the number of word lines WL.

The semiconductor memory device according to some example embodiments may include various contact arrangements formed on the cell active region ACT. The various contact arrangements may include, for example, a digit contact or a direct contact DC, a buried contact BC, a landing pad LP, and the like.

The direct contact DC may refer to a contact that electrically connects the cell active region to the bit line BL. The buried contact BC may refer to a contact that connects the cell active region ACT to a lower electrode (191 of FIG. 4) of a memory element such as a memristor and/or a capacitor. A contact area between the buried contact BC and the cell active region ACT may be small in view of an arrangement structure. Therefore, a conductive landing pad LP may be introduced to enlarge the contact area with the lower electrode (191 of FIG. 4) of the capacitor together with the contact area with the cell active region ACT.

The landing pad LP may be disposed between the cell active region ACT and the buried contact BC, and may be disposed between the buried contact BC and the lower electrode (191 of FIG. 4) of the capacitor. In the semiconductor memory device according to various example embodiments, the landing pad LP may be disposed between the buried contact BC and the lower electrode of the capacitor. As the contact area is enlarged through the introduction of the landing pad LP, contact resistance between the cell active region ACT and the lower electrode of the capacitor may be reduced, and/or a signal margin may be improved.

The direct contact DC may be connected to the bit line connection region 103a. The buried contact BC may be connected to the storage connection region 103b. As the buried contact BC is disposed at both end portions of the cell active region ACT, the landing pad LP may be disposed to partially overlap the buried contact BC in a state that it is adjacent to both ends of the cell active region ACT. For example, the buried contact BC may be formed to overlap the cell active region ACT and the cell element isolation layer (105 of FIG. 4) between adjacent word lines WL and between adjacent bit lines BL.

The word line WL may be arranged or formed in a structure buried in or within a substrate 100. The word line WL may be disposed across the cell active region ACT between the direct contacts DC or the buried contacts BC. As shown, two word lines WL may be disposed to cross one cell active region ACT. As the cell active region ACT is extended in the third direction D3, the word line WL may have an angle less than 90° with the cell active region ACT.

The direct contact DC and the buried contact BC may be symmetrically disposed. For this reason, the direct contact DC and the buried contact BC may be disposed on a straight line along the first direction D1 and the second direction D2. Unlike the direct contact DC and the buried contact BC, the landing pad LP may be disposed in a zigzag shape in the second direction D2 in which the bit line BL is extended. Alternatively or additionally, the landing pad LP may be disposed to overlap the same side portion of each bit line BL in the first direction D1 in which the word line WL is extended. For example, each landing pad LP of a first line may overlap a left side of a corresponding bit line BL, and each landing pad LP of a second line may overlap a right side of a corresponding bit line BL.

Referring to FIGS. 1 to 8, the semiconductor memory device according to some example embodiments may include a plurality of cell gate structures 110, a plurality of bit line structures 140ST and a plurality of bit line contacts 146.

The substrate 100 may include a cell region 20, a cell region isolation layer 22 and a peripheral region 24. The substrate 100 may be or may include a silicon substrate or a silicon-on-insulator (SOI). Alternatively, the substrate 100 may include, but is not limited to, silicon germanium, silicon germanium on insulator (SGOI), indium antimonide, lead telluride compound, indium arsenide, indium phosphide, gallium arsenide or gallium antimonide. The substrate 100 may be doped or may be undoped.

The plurality of cell gate structures 110, the plurality of bit line structures 140ST, a plurality of storage contacts 120 and an information storage 190 may be disposed in the cell region 20. A peripheral gate structure 240ST may be disposed in the peripheral region 24.

The cell element isolation layer 105 may be formed in the substrate 100 of the cell region 20. The cell element isolation layer 105 may have a shallow trench isolation (STI) structure having excellent element isolation characteristics. The cell element isolation layer 110 may define the cell active region ACT in the cell region 20. The cell active region ACT defined by the element isolation layer 110 may have a long island shape including a short axis and a long axis as shown in FIG. 1. In some example embodiments, the cell active region ACT may have an oblique shape so as to have an angle less than 90° with respect to the word line WL formed in the cell element isolation layer 105. In some example embodiments, the cell active region ACT may have an oblique shape so as to have an angle less than 90° with respect to the bit line BL formed on the cell element isolation layer 105.

The cell region isolation layer 22 may be also provided with a cell boundary isolation layer having a shallow trench isolation (STI) structure.

Each of the element isolation layer 105 and the cell region isolation layer 22 may include, but is not limited to, at least one of a silicon oxide layer, a silicon nitride layer or a silicon oxynitride layer. In FIGS. 4 to 8, each of the cell element isolation layer 105 and the cell region isolation layer 22 is shown as being formed of one insulating layer, but is only for convenience of description, and the present disclosure is not limited thereto. Each of the cell element isolation layer 105 and the cell region isolation layer 22 may be formed of one insulating layer or a plurality of insulating layers depending on widths of the cell element isolation layer 105 and the cell region isolation layer 22.

Although an upper surface of the cell element isolation layer 105, an upper surface of the substrate 100, and an upper surface of the cell region isolation layer 22 are shown as being placed on the same plane or coplanar with each other, example embodiments are not limited thereto.

The cell gate structure 110 may be formed in the substrate 100 and the cell element isolation layer 105. The cell gate structure 110 may be formed across the cell element isolation 105 and the cell active region ACT defined by the cell element isolation layer 105. The cell gate structure 110 may include a cell gate trench 115 formed in the substrate 100 and the cell element isolation layer 105, a cell gate electrode 112, a cell gate capping pattern 113, and a cell gate capping conductive layer 114. In this case, the cell gate electrode 112 may correspond to the word line WL. Unlike the shown example, the cell gate structure 110 may not include a cell gate capping conductive layer 114.

The cell gate insulating layer 111 may be extended along a sidewall and a bottom surface of the cell gate trench 115. The cell gate insulating layer 111 may be extended along a profile of at least a portion of the cell gate trench 115. The cell gate insulating layer 111 may include at least one of, for example, silicon oxide, silicon nitride, silicon oxynitride, or a high dielectric constant material having a dielectric constant higher than that of silicon oxide. The high dielectric constant material may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or their combination.

The cell gate electrode 112 may be formed or arranged on the cell gate insulating layer 111. The cell gate electrode 112 may fill a portion of the cell gate trench 115. The cell gate capping conductive layer 114 may be extended along an upper surface of the cell gate electrode 112.

The cell gate electrode 112 may include at least one of a metal, a metal alloy, a conductive metal nitride, a conductive metal carbonitride, a conductive metal carbide, a metal silicide, a doped semiconductor material such as doped polysilicon, a conductive metal oxynitride or a conductive metal oxide. The cell gate electrode 112 may include at least one of, for example, TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, or their combination, but is not limited thereto. The cell gate capping conductive layer 114 may include, for example, doped or undoped polysilicon and/or doped or undoped polysilicon germanium, but is not limited thereto.

The cell gate capping pattern 113 may be disposed on the cell gate electrode 112 and the cell gate capping conductive layer 114. The cell gate capping pattern 113 may fill the cell gate trench 115 remaining after the cell gate electrode 112 and the cell gate capping conductive layer 114 are formed. The cell gate insulating layer 111 is shown as being extended along a sidewall of the cell gate capping pattern 113, but is not limited thereto. The cell gate capping pattern 113 may include at least one of, for example, silicon nitride (SiN), silicon oxynitride (SiON), silicon oxide (SiO$_2$), silicon carbonitride (SiCN), silicon oxycarbonitride (SiOCN) or their combination.

Although not shown, an impurity doping region may be formed on at least one side of the cell gate structure 110. The impurity doping region may be or may correspond to a source/drain region of a transistor.

The bit line structure 140ST may include a cell conductive line 140 and a cell line capping layer 144. The cell conductive line 140 may be formed on the cell element isolation layer 105 and the substrate 100 in which the cell gate structure 110 is formed. The cell conductive line 140 may cross the cell element isolation layer 105 and the cell active region ACT defined by the cell element isolation layer 105. The cell conductive line 140 may be formed to cross the cell gate structure 110. In this case, the cell conductive line 140 may correspond to the bit line BL.

The cell conductive line 140 may be a multi-layer. The cell conductive line 140 may include, for example, a first cell conductive layer 141, a second cell conductive layer 142 and a third cell conductive layer 143. The first to third cell conductive layers 141, 142 and 143 may be sequentially stacked on the substrate 100 and the cell element isolation layer 105 in a direction away from the substrate 100. In some example embodiments, the cell conductive line 140 is shown as a three-layered film, but is not limited thereto.

Referring to FIG. 4, the cell element isolation layer 105 may include a first region 105_1 in which the bit line contact 146 to be described later is formed, and a second region 105_2 in which the bit line contact 146 is not formed. A cell conductive line 140_2 formed on the first region 105_1 may include second and third cell conductive layers 142 and 143. A cell conductive line 140_1 formed on the second region 105_2 may include first to third cell conductive layers 141, 142 and 143.

In some example embodiments, a height of an upper surface of the third cell conductive layer 143 may be the same as that of the cell region 20 in the boundary region.

The first to third cell conductive layers 141, 142 and 143 may include at least one of, for example, a semiconductor material doped with impurities such as doped polysilicon, a conductive silicide compound, a conductive metal nitride, a metal or a metal alloy. For example, the first cell conductive layer 141 may include a doped semiconductor material such as polysilicon. The second cell conductive layer 142 may include at least one of a conductive silicide compound or a conductive metal nitride. The third cell conductive layer 143 may include at least one of a metal such as tungsten W and/or a metal alloy, but is not limited thereto.

The bit line contact 146 may be formed between the cell conductive line 140 and the substrate 100. For example, the cell conductive line 140 may be formed on the bit line contact 146. For example, the bit line contact 146 may be formed at a point where the cell conductive line 140 crosses a center portion of the cell active region ACT having a long island shape. The bit line contact 146 may be formed between the bit line connection region 103a and a wiring structure 140.

The bit line contact 146 may electrically connect the cell conductive line 140 to the substrate 100. In this case, the bit line contact 146 may correspond to the direct contact DC. The bit line contact 146 may include at least one of, for example, a semiconductor material doped with impurities such as doped polysilicon, a conductive silicide compound, a conductive metal nitride or a metal.

In FIG. 4, in a region overlapped with an upper surface of the bit line contact 146, the cell conductive line 140 may include a second cell conductive layer 142 and a third cell conductive layer 143. In a region that is not overlapped with the upper surface of the bit line contact 146, the cell conductive line 140 may include first to third cell conductive layers 141, 142 and 143.

The cell line capping layer 144 may be disposed on the cell conductive line 140. The cell line capping layer 144 may be extended in the second direction D2 along an upper surface of the cell conductive line 140. The cell line capping layer 144 may include at least one of, for example, a silicon nitride layer, silicon oxynitride, silicon carbonitride or silicon oxycarbonitride. In the semiconductor memory device according to some example embodiments, the cell line capping layer 144 may include, for example, a silicon nitride layer. The cell line capping layer 144 is shown as a single layer, but is not limited thereto. For example, the cell line capping layer 144 may be a multi-layer. However, when each layer constituting the multi-layer is made of the same material, the cell line capping layer 144 may be viewed as a single layer, e.g. as a homogenous single layer.

A cell insulating layer 130 may be formed on the substrate 100 and the cell element isolation layer 105. In more detail, the cell insulating layer 130 may be arranged or formed on the cell element isolation layer 105 and the substrate 100 in which the bit line contact 146 is not formed. The cell insulating layer 130 may be formed between the substrate 100 and the cell conductive line 140 and between the cell element isolation layer 105 and the cell conductive line 140.

The cell insulating layer 130 may be a single layer, but may instead be a multi-layer that includes a first cell insulating layer 131 and a second cell insulating layer 132 as shown. For example, the first cell insulating layer 131 may include a silicon oxide layer and the second cell insulating layer 132 may include a silicon nitride layer, but these layers are not limited thereto.

A cell line spacer 150 may be disposed on sidewalls of the cell conductive line 140 and the cell line capping layer 144. The cell line spacer 150 may be formed on the substrate 100 and the cell element isolation layer 105 in a portion of the cell conductive line 140 in which the bit line contact 146 is formed. The cell line spacer 150 may be disposed on sidewalls of the cell conductive line 140, the cell line capping layer 144 and the bit line contact 146.

However, in the remaining portion of the cell conductive line 140 in which the bit line contact 146 is not formed, the cell line spacers 150 may be disposed on the cell insulating layer 130. The cell line spacers 150 may be disposed on the sidewalls of the cell conductive line 140 and the cell line capping layer 144.

The cell line spacer 150 may be a single layer, but may be a multi-layer that includes first to fourth cell line spacers 151, 152, 153 and 154 as shown. For example, the first to fourth cell line spacers 151, 152, 153 and 154 may include one of a silicon oxide layer, a silicon nitride layer, a silicon oxynitride layer (SiON), a silicon oxycarbonitride layer (SiOCN), an air and their combination, but is not limited thereto.

For example, the second cell line spacer 152 may not be disposed on the cell conductive layer 130, but may be disposed on the sidewall of the bit line contact 146.

In FIG. 6, the bit line structure 140ST may be longitudinally extended from the cell region 20 to the boundary region along the second direction D2. The bit line structure 140ST may include one sidewall defined on the cell region isolation layer 22. A cell boundary spacer 246 may be disposed on one sidewall of the bit line structure 140ST.

Referring to FIG. 5, a fence pattern 170 may be disposed on the substrate 100 and the cell element isolation layer 105. The fence pattern 170 may be formed to overlap the cell gate structure 110 formed in the substrate 100 and the cell element isolation layer 105. The fence pattern 170 may be disposed between the bit line structures 140ST extended in the second direction D2. The fence pattern 170 may include at least one of, for example, silicon oxide, silicon nitride, silicon oxynitride or their combination.

The storage contact 120 may be disposed between the cell conductive lines 140 adjacent to each other in the first direction D1. The storage contact 120 may be disposed between the fence patterns 170 adjacent to each other in the second direction D2. The storage contact 120 may overlap the substrate 100 and the cell element isolation layer 105 between adjacent cell conductive lines 140. The storage contact 120 may be connected to the storage connection region 103b of the cell active region ACT. The storage contact 120 may be or may correspond to the buried contact BC.

The storage contact 120 may include at least one of, for example, a semiconductor material doped with impurities such as doped polysilicon, a conductive silicide compound, a conductive metal nitride or a metal.

A storage pad 160 may be formed on the storage contact 120. The storage pad 160 may be electrically connected to the storage contact 120. In this case, the storage pad 160 may correspond to the landing pad LP.

The storage pad 160 may overlap a portion of an upper surface of the bit line structure 140ST. The storage pad 160 may include at least one of, for example, a semiconductor material doped with impurities such as doped polysilicon, a conductive silicide compound, a conductive metal nitride, a conductive metal carbide, a metal or a metal alloy.

A storage pad spacer 160SP may be disposed on the storage contact 120. The storage pad spacer 160SP may be disposed between the storage pad 160 and the bit line structure 140ST and between the storage pattern 160 and the fence pattern 170. Unlike the shown example, the storage pad spacer 160SP may be omitted.

The storage pad spacer 160SP may include at least one of, for example, a silicon oxide layer, a silicon nitride layer, a silicon oxynitride layer, a silicon oxycarbonitride layer or a silicon carbonitride layer (SiCN).

An isolation insulating layer 180 may be formed on the storage pad 160 and the bit line structure 140ST. For example, the isolation insulating layer 180 may be disposed on the cell line capping layer 144. The isolation insulating layer 180 may define a region of the storage pad 160 that forms a plurality of isolated regions. In some example embodiments, the isolation insulating layer 180 may not cover an upper surface of the storage pad 160.

The isolation insulating layer 180 includes an insulating material to electrically isolate the plurality of storage pads 160 from each other. For example, the isolation insulating layer 180 may include at least one of a silicon oxide layer, a silicon nitride layer, a silicon oxynitride layer, a silicon oxycarbonitride layer or a silicon carbonitride layer.

A first etch stop layer 292 may be disposed on the isolation insulating layer 180 and the storage pad 160. The first etch stop layer 292 may be extended to the peripheral region 24 as well as the cell region 20. The first etch stop layer 292 may include at least one of a silicon nitride layer, a silicon carbonitride layer, a silicon boron nitride layer (SiBN), a silicon oxynitride layer or a silicon oxycarbide layer.

The information storage 190 may be disposed on the storage pad 160. The information storage 190 may be electrically connected to the storage pad 160. A portion of the information storage 190 may be disposed in the first etch stop layer 292. The information storage 190 may include, for example, a capacitor, but is not limited thereto. The information storage 190 includes a first lower electrode 191, a first capacitor dielectric layer 192 and a first upper electrode 193, and may or may not correspond to a capacitor.

The first lower electrode 191 may be disposed on the storage pad 160. The first lower electrode 191 is shown as having a pillar shape, but is not limited thereto. The first lower electrode 191 may have a cylindrical shape; however, example embodiments are not limited thereto, and the first lower electrode 191 may have a prismatic and/or tubular shape. The first capacitor dielectric layer 192 is formed on the first lower electrode 191. The first capacitor dielectric layer 192 may be formed along a profile of the first lower electrode 191. The first upper electrode 193 is formed on the first capacitor dielectric layer 192. The first upper electrode 193 may surround outer sidewalls of the first lower electrode 191.

For example, the first capacitor dielectric layer 192 may be disposed at a portion vertically overlapped with the first upper electrode 193. For another example, unlike the shown example, the first capacitor dielectric layer 192 may include a first portion vertically overlapped with the first upper electrode 193 and a second portion that is not vertically overlapped with the first upper electrode 193. For example, in some example embodiments the second portion of the first capacitor dielectric layer 192 may be a portion that is not covered by the first upper electrode 193.

Each of the first lower electrode 191 and the first upper electrode 193 may include, for example, a doped semiconductor material such as doped polysilicon, a conductive metal nitride (e.g., titanium nitride, tantalum nitride, niobium nitride or tungsten nitride), a metal (e.g., ruthenium, iridium, titanium or tantalum) and a conductive metal oxide (e.g., iridium oxide, niobium oxide, etc.), but is not limited thereto.

The first capacitor dielectric layer 192 may include one of, for example, silicon oxide, silicon nitride, silicon oxynitride, a high dielectric constant material and their combination, but is not limited thereto. In the semiconductor memory device according to some example embodiments, the first capacitor dielectric layer 192 may include a stacked layer structure in which zirconium oxide, aluminum oxide and zirconium oxide are sequentially stacked. In the semiconductor memory device according to some example embodiments, the first capacitor dielectric layer 192 may include a dielectric layer containing hafnium (Hf). In the semiconductor memory device according to some example embodiments, the first capacitor dielectric layer 192 may have a stacked layer structure of a ferroelectric material layer and a paraelectric material layer.

Referring to FIG. 7, the peripheral gate structure 240ST may be disposed in at least a portion of the boundary region and the peripheral region 24. A portion of the peripheral gate structure 240ST is shown as being overlapped with the cell region isolation layer 22, but is not limited thereto. The peripheral gate structure 240ST may be disposed to be adjacent to the bit line structure 140ST, which is extended in the second direction D2, in the second direction D2.

The peripheral gate structure 240ST may include a peripheral gate insulating layer 230, a peripheral conductive line 240 and a peripheral capping layer 244, which are sequentially stacked on the substrate 100. The peripheral gate structure 240ST may include a peripheral spacer 245 disposed on a sidewall of the peripheral conductive line 240 and a sidewall of the peripheral capping layer 244.

The peripheral conductive line 240 may include first to third peripheral conductive layers 241, 242 and 243 sequentially stacked on the peripheral gate insulating layer 230.

The first peripheral conductive layer 241 may include the same material as that of the first cell conductive layer 141. The second peripheral conductive layer 242 may include the same material as that of the second cell conductive layer 142. The third peripheral conductive layer 243 may include the same material as that of the third cell conductive layer 143, but is not limited thereto.

The peripheral gate insulating layer 230 may include, for example, silicon oxide, silicon nitride, silicon oxynitride or a high dielectric constant material having a dielectric constant higher than that of silicon oxide.

The peripheral spacer 245 may include at least one of, for example, silicon nitride, silicon oxynitride, silicon oxide, silicon carbonitride, silicon oxycarbonitride or their combination. Although the peripheral spacer 245 is shown as a single layer, example embodiments are not limited thereto. The peripheral spacer 245 may be a multi-layer.

The peripheral gate capping layer 244 may be disposed on the third peripheral conductive layer 243. The peripheral capping layer 244 may include at least one of, for example, a silicon nitride layer, silicon oxynitride or silicon oxide. The peripheral gate capping layer 244 is shown as a single layer, but is not limited thereto.

A second etch stop layer 250 may be disposed on the substrate 100. The second etch stop layer 250 may be formed along a profile of the peripheral gate structure 240ST. The second etch stop layer 250 may be extended along a sidewall of the cell boundary spacer 246.

The second etch stop layer 250 may include at least one of, for example, a silicon nitride layer, silicon oxynitride, silicon carbonitride or silicon oxycarbonitride.

A cell interlayer insulating layer 295 may be disposed on the second etch stop layer 250. For example, the cell interlayer insulating layer 295 may be disposed on the cell region isolation layer 22. The cell interlayer insulating layer 295 may be disposed between the peripheral gate structure 240ST and the bit line structure 140ST. The cell interlayer insulating layer 295 may be disposed between the cell conductive line 140 and the peripheral conductive line 240, which face each other in the second direction D2. The cell interlayer insulating layer 295 may be disposed near the bit line structure 140ST.

The cell interlayer insulating layer 295 may include, for example, an oxide-based insulating material.

An insertion interlayer insulating layer 291 is disposed on the peripheral gate structure 240ST and the cell interlayer insulating layer 295. The insertion interlayer insulating layer 291 may cover the peripheral gate structure 240ST and the cell interlayer insulating layer 295. The insertion interlayer insulating layer 291 may cover the second etch stop layer 250 protruded above an upper surface of the cell interlayer insulating layer 295.

The insertion interlayer insulating layer 291 may include a material different from that of the cell interlayer insulating layer 295. The insertion interlayer insulating layer 291 may include, for example, a nitride-based insulating material. For example, the insertion interlayer insulating layer 291 may include silicon nitride.

A peripheral wiring line 265 may be disposed on the insertion interlayer insulating layer 291. A bit line contact plug 261 may be connected to the cell conductive line 140 by passing through the cell line capping layer 144.

The peripheral wiring line 265 and the bit line contact plug 261 may include the same material as that of the storage pad 160.

The first etch stop layer 292 may be disposed on the peripheral wiring line 265 and the bit line contact plug 261.

A peripheral interlayer insulating layer 293 may be disposed on the first etch stop layer 292. The peripheral interlayer insulating layer 293 may cover a sidewall of the first upper electrode 193. The peripheral interlayer insulating layer 293 may include an insulating material.

Referring to FIG. 8, interlayer insulating layers 291a and 291b may be formed on the bit line structure 140ST. For example, the interlayer insulating layers 291a and 291b may include at least one of a silicon oxide layer, a silicon nitride layer, a silicon oxynitride layer, a silicon oxycarbonitride layer or a silicon carbonitride layer, but is not limited thereto.

The peripheral wiring line 265 may be disposed in the interlayer insulating layer 291b and electrically connected to the bit line structure 140ST or a peripheral circuit. Although not shown in detail, the peripheral wiring line 265 may be connected to the cell conductive line 140 by passing through at least a portion of the interlayer insulating layers 291a and 291b.

A spacer 150e may be disposed on sidewalls of the cell conductive line 140 and the cell line capping layer 144. The spacer 150e may be formed on the substrate 100 and the cell region isolation layer 22.

The spacer 150e may be a single layer, but as shown, the spacer 150e may be a multi-layer that includes first to third spacers 151e, 153e and 154e. For example, the first to third spacers 151e, 153e and 154e may independently or collectively include one or more of a silicon oxide layer, a silicon nitride layer, a silicon oxynitride layer (SiON), a silicon oxycarbonitride layer (SiOCN), an air and combinations thereof, but is not limited thereto.

According to some example embodiments, the upper surface of the third cell conductive layer 143 may be the same in the cell region 20 and the cell region isolation layer 22.

Referring to FIG. 6, a thickness T13 of the third cell conductive layer 143 in the boundary region may be thicker than a thickness T11 of the third cell conductive layer 143 disposed on the first cell conductive layer 141 of the cell region 20 or a thickness T12 of the third cell conductive layer 143 on the bit line contact 146. The thickness T12 of the third cell conductive layer 143 on the bit line contact 146 may be thicker than the thickness T11 of the third cell conductive layer 143 disposed on the first cell conductive layer 141 of the cell region 20. For example, the thickness T12 of the third cell conductive layer 143 on the bit line contact 146 may be thicker than the thickness T11 of the third cell conductive layer 143 disposed on the first cell conductive layer 141 of the cell region 20, and may be thinner than the thickness T13 of the third cell conductive layer 143 in the boundary region.

Referring to FIG. 4, an upper surface U22 of the bit line contact 146 may be lower than an upper surface U21 of the first cell conductive layer 141 of the cell region 20. Referring to FIGS. 4 and 8, an upper surface U23 of the first cell conductive layer 141 in the boundary region may be lower than the upper surface U21 of the first cell conductive layer 141 of the cell region 20.

For example, the upper surface U22 of the bit line contact 146 may be lower than or below the upper surface U21 of the first cell conductive layer 141 of the cell region 20 and may be higher than or above the upper surface U23 of the first cell conductive layer 141 in the boundary region.

Also, referring to FIG. 4, an upper surface U32 of the second cell conductive layer 142 on the bit line contact 146 may be lower than an upper surface U31 of the second cell conductive layer 142 on the first cell conductive layer 142. Referring to FIGS. 4 and 8, an upper surface U33 of the second cell conductive layer 142 in the boundary region may be lower than or below an upper surface U32 of the second cell conductive layer 142 on the bit line contact 146.

Referring to FIGS. 4 and 8, a thickness T23 of the first cell conductive layer 141 in the boundary region may be thinner than a thickness T21 of the first cell conductive layer 141 or a thickness T22 of the bit line contact 146 in the cell region 20.

According to some example embodiments, shapes of the cell conductive layer 140 of the bit line structure 140ST in the cell region and the boundary region are formed to be different from each other, so that a defect in reliability of an element due to a decrease in the width of the cell conductive layer 140 in the boundary region may be reduced.

Figure 9:
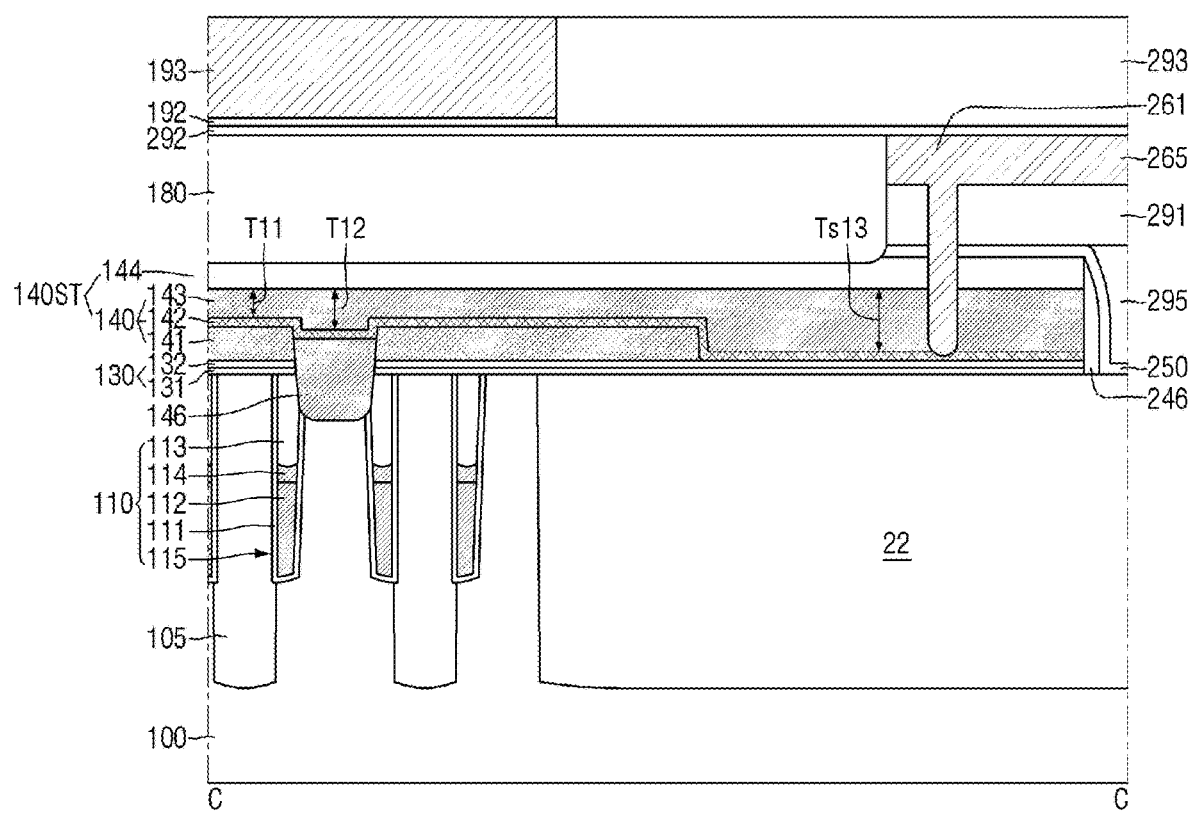
FIG. 9 is a view illustrating a semiconductor memory device according to some example embodiments.
Figure 10:
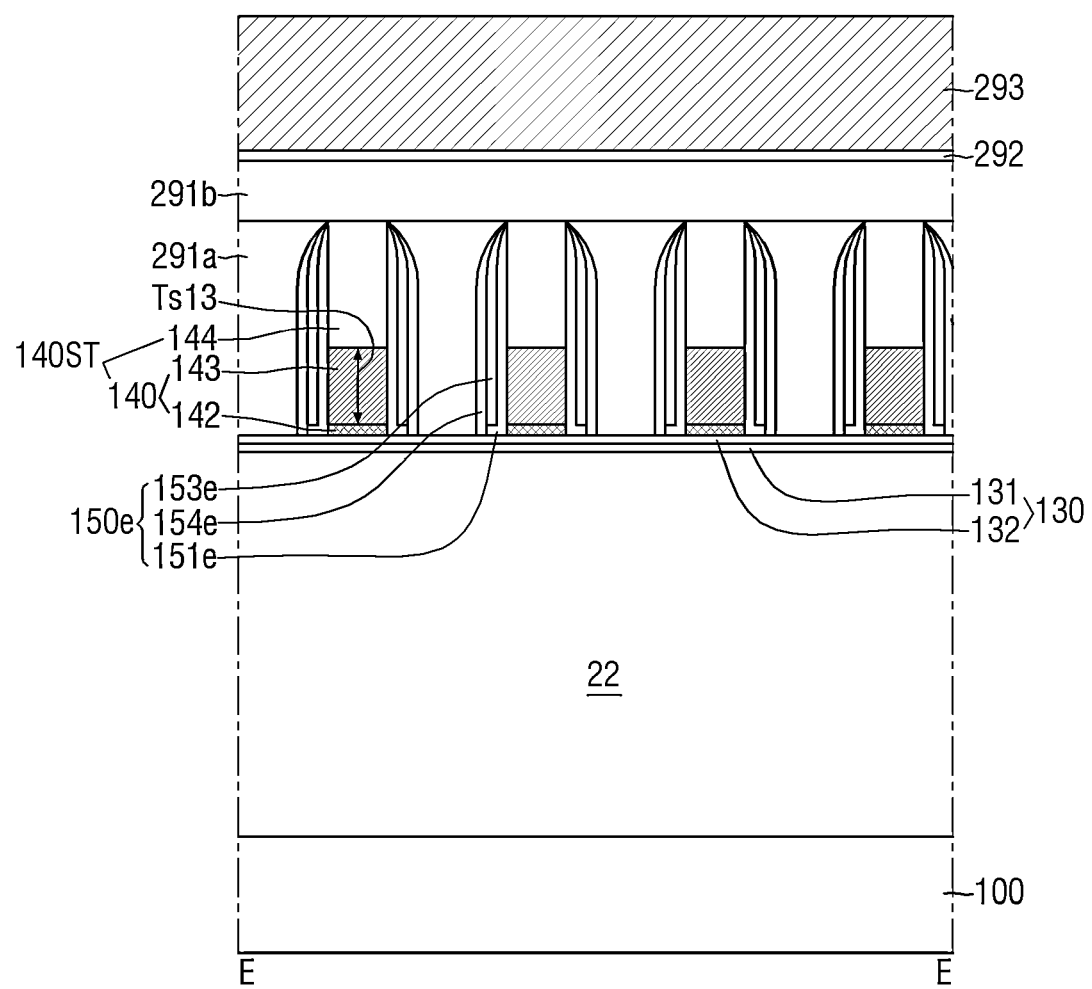
FIG. 10 is a view illustrating a semiconductor memory device according to some example embodiments.
Figure 11A:
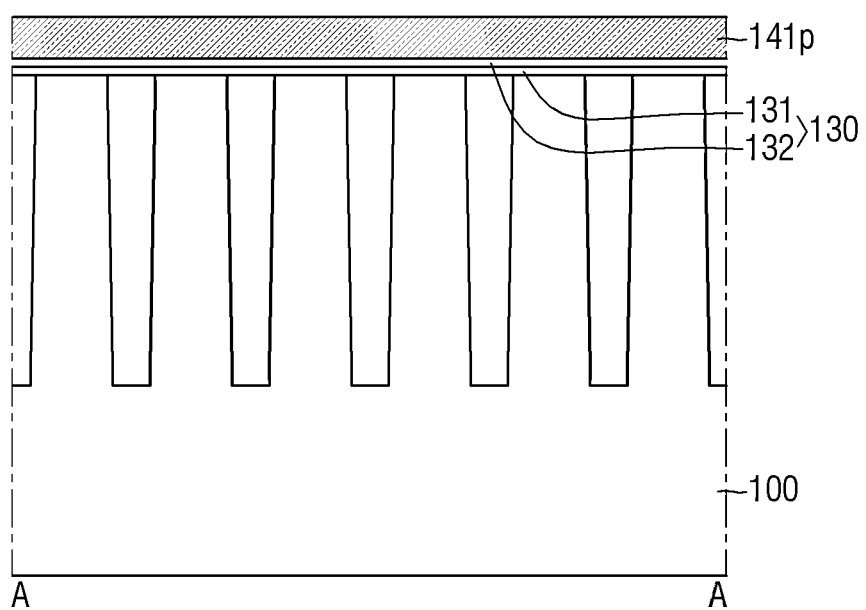
FIGS. 11a to 19c are views illustrating intermediate steps to describe a method of fabricating a semiconductor device according to some example embodiments.
Figure 11B:
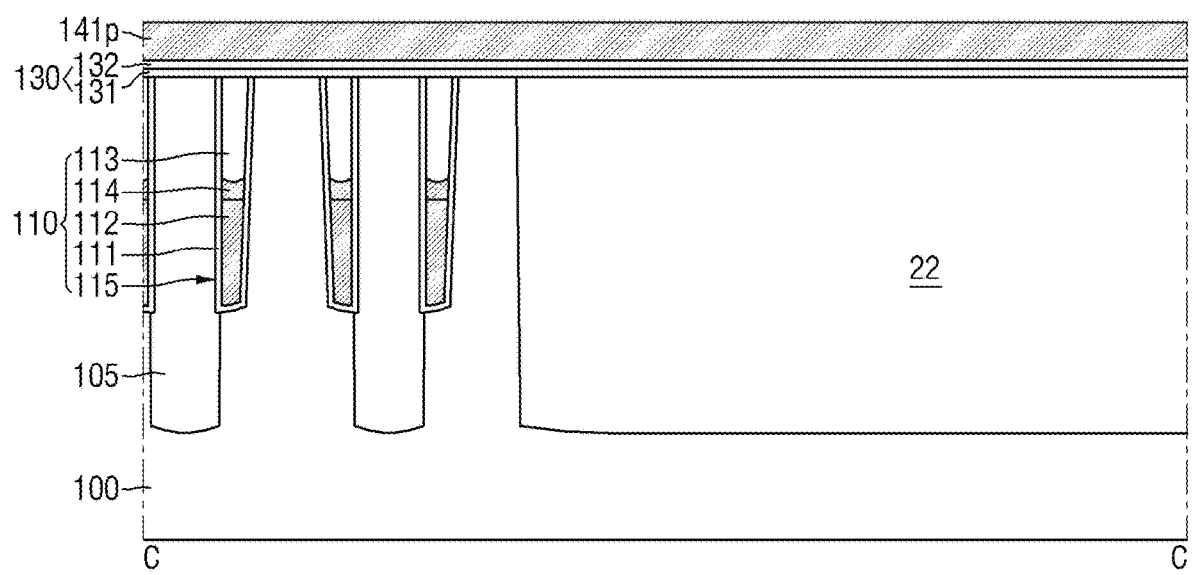
Figure 11C:
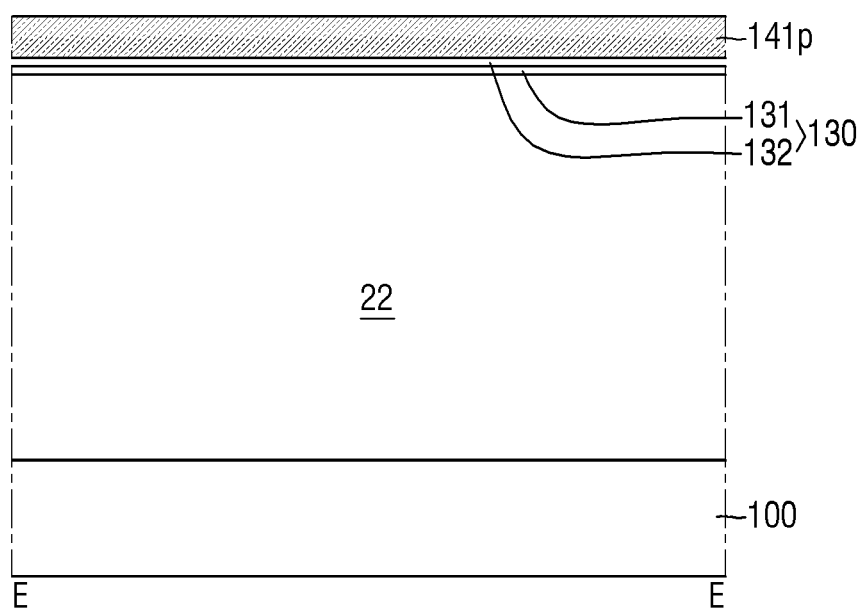

FIG. 9 is a view illustrating a semiconductor memory device according to some example embodiments. FIG. 10 is a view illustrating a semiconductor memory device according to some example embodiments.

For reference, FIG. 9 is a view corresponding to a cross-sectional view taken along the line C-C of FIG. 2. FIG. 10 is a view corresponding to a cross-sectional view taken along line E-E of FIG. 2. For convenience of description, the following description will be based on differences from the description made with reference to FIGS. 1 to 8.

Referring to FIGS. 9 and 10, in the boundary region, the first cell conductive layer 141 may be completely removed so that the third cell conductive layer 143 may be formed directly on the second cell conductive layer 142. In this case, a thickness Ts13 of the third cell conductive layer 143 may be thicker than the thickness T13 of the third cell conductive layer 143 of FIG. 6.

Meanwhile, unlike the shown example, the second cell conductive layer 142 may not be interposed. In this case, the third cell conductive layer 143 may be formed on the cell insulating layer 130 in the boundary region, and the third cell conductive layer 143 may be formed on the first cell conductive layer 141 in the cell region 20.

FIGS. 11a to 19c are views illustrating intermediate steps to describe a method of fabricating a semiconductor device according to some example embodiments, and represent cross-sectional perspectives along lines A-A, C-C, and E-E of FIGS. 1 and 2, for example. In the description related to the method of fabricating a semiconductor device, the description repeated with the description made with reference to FIGS. 1 to 10 will be briefly made or omitted.

Referring to FIGS. 1, 2 and 11a to 11c, a substrate 100, which includes a cell region 20, a peripheral region 24 and a cell region isolation layer 22, is provided.

A cell gate structure 110 may be formed in the substrate 100 of the cell region 20. The cell gate structure 110 may be extended longitudinally in a first direction D1. The cell gate structure 110 may include or may define a cell gate trench 115, and may include a cell gate insulating layer 111, a cell gate electrode 112, a cell gate capping pattern 113 and a cell gate capping conductive layer 114.

Subsequently, a cell insulating layer 130 may be formed, e.g. may be deposited and/or may be grown, on the cell region 20. Although not shown in detail, the cell insulating layer 130 may expose the substrate 100 of the peripheral region 24.

A pre-first cell conductive layer 141p may be formed, e.g. may be deposited with a process such as a physical vapor deposition (PVD) process and/or a chemical vapor deposition (CVD) process, on the cell insulating layer 130. The pre-first cell conductive layer 141p may be formed along an upper surface of the upper cell insulating layer 130.

Figure 12A:
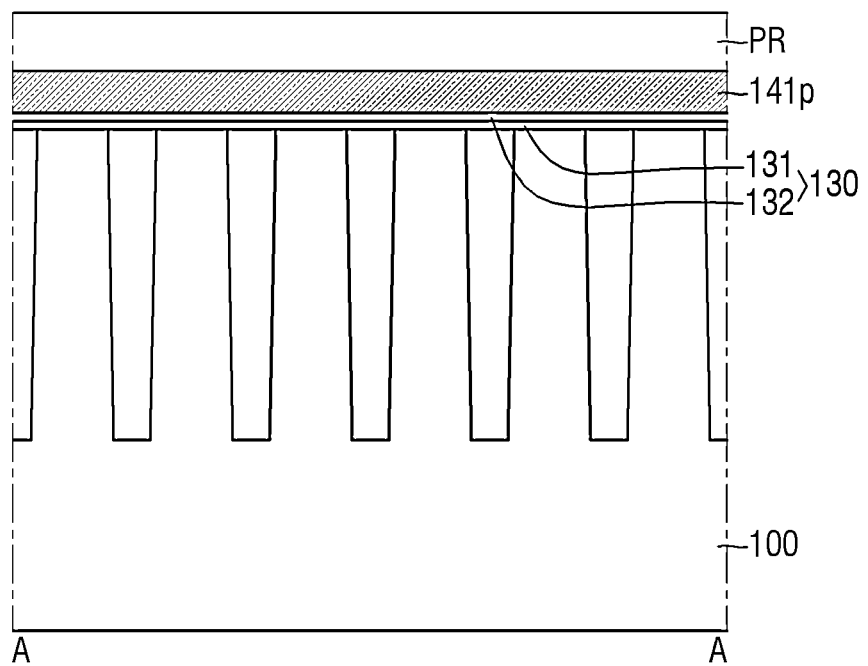
Figure 12B:
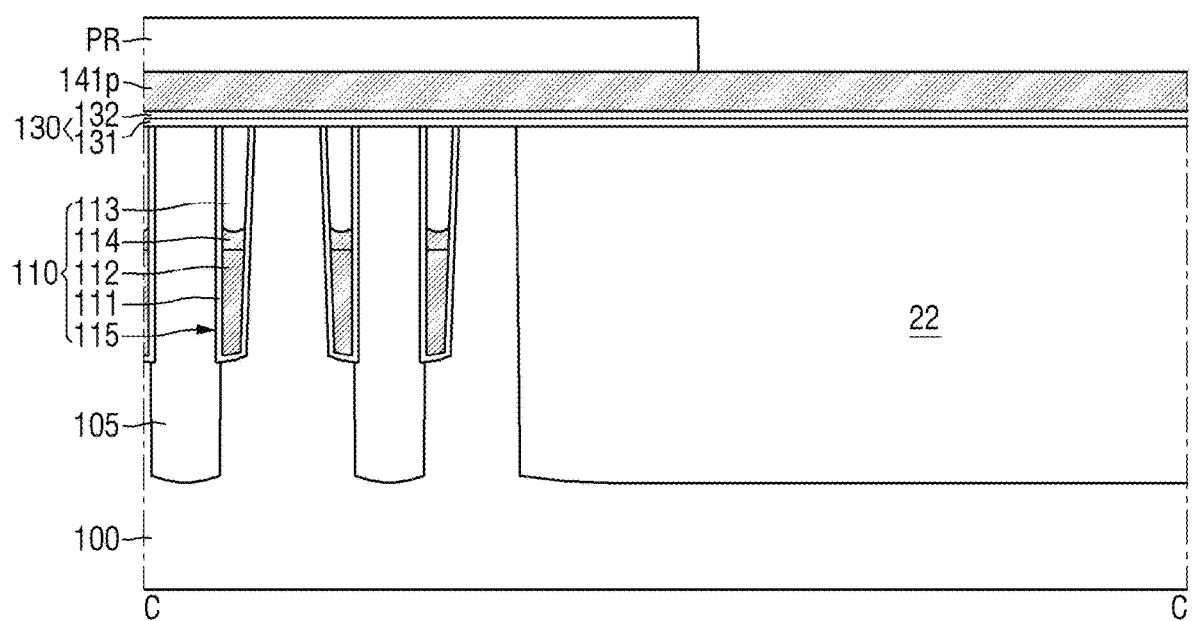
Figure 12C:
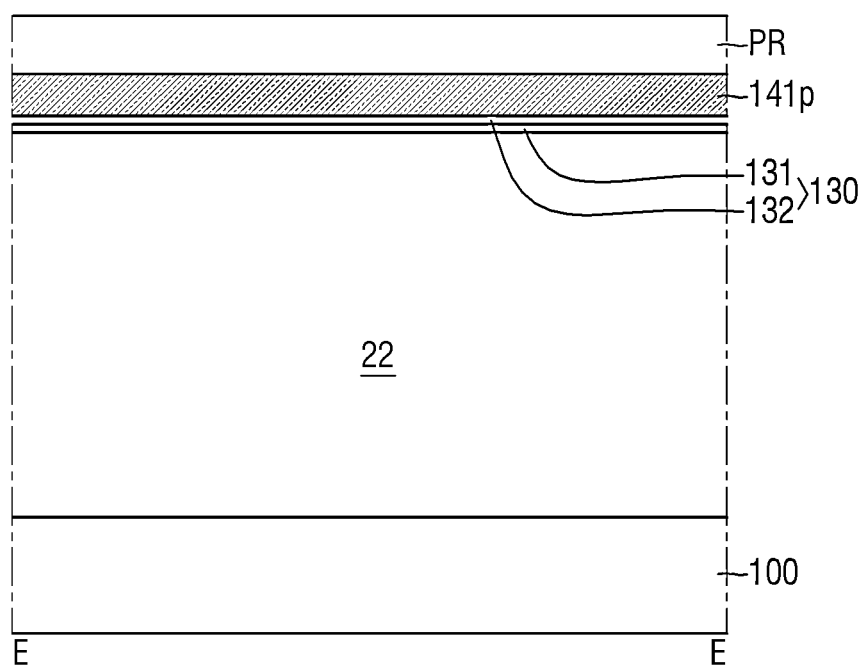

Referring to FIGS. 12a to 12c, a photoresist PR may be formed, e.g. may be deposited and/or spun and/or patterned, on the pre-first cell conductive layer 141p. The photoresist PR may be formed on at least a partial region of the pre-first cell conductive layer 141p. The other region of the pre-first cell conductive layer 141p in which the photoresist PR is not formed may be exposed as illustrated in FIG. 12b. The photoresist PR may include a photosensitive insulating material, but is not limited thereto. For example, other layers such as a hardmask layer and/or an antireflective coating layer, may be included in and/or separately deposited in conjunction with the photoresist PR.

Figure 13A:
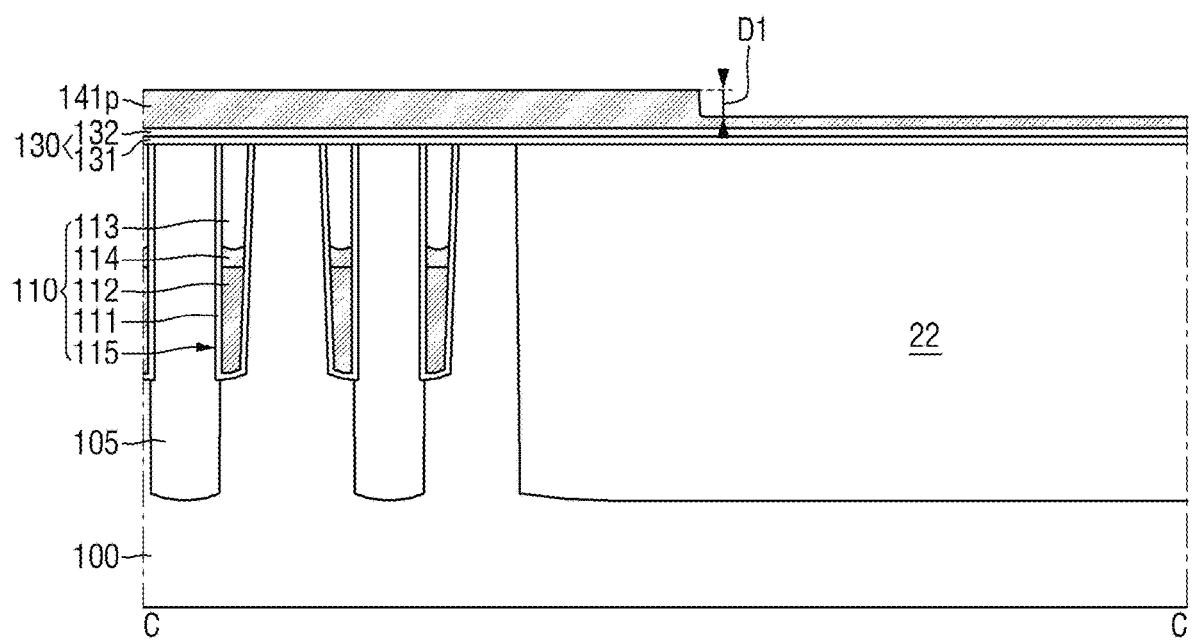
Figure 13B:
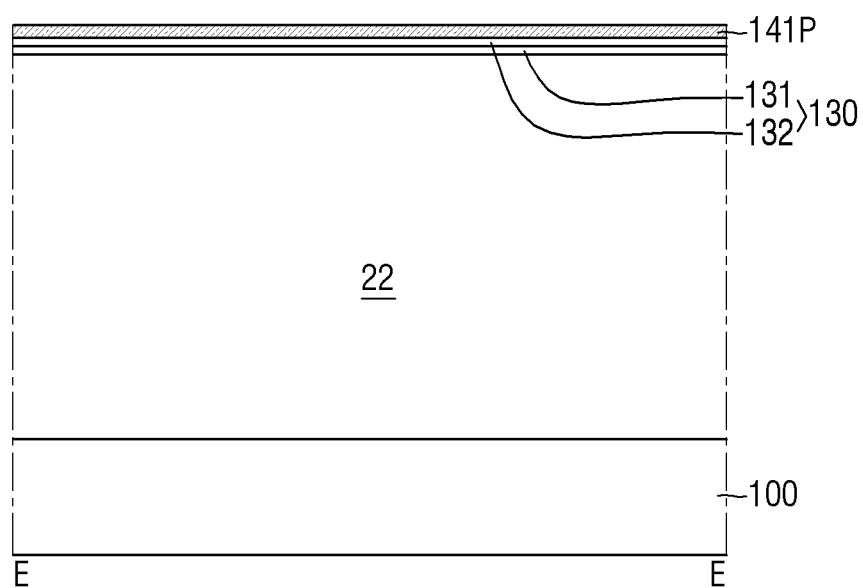

Referring to FIGS. 13a and 13b, the pre-first conductive layer 141p on a partial region of the cell region isolation layer 22 may be removed, e.g. may be etched with a wet etching process and/or with a dry-etching process, as much as a first thickness D1. As described above, the photoresist PR is formed on the pre-first cell conductive layer 141p, and the pre-first cell conductive layer 141p on the cell region isolation layer 22 may be removed as much as a thickness, such as a dynamically determined (or, alternatively, predetermined) thickness by using an etching process, and may not be fully etched. Therefore, the pre-first cell conductive layer 141p on the cell region 20 may be formed to be thicker than the pre-first cell conductive layer 141p on the cell region isolation layer 22.

Figure 14A:
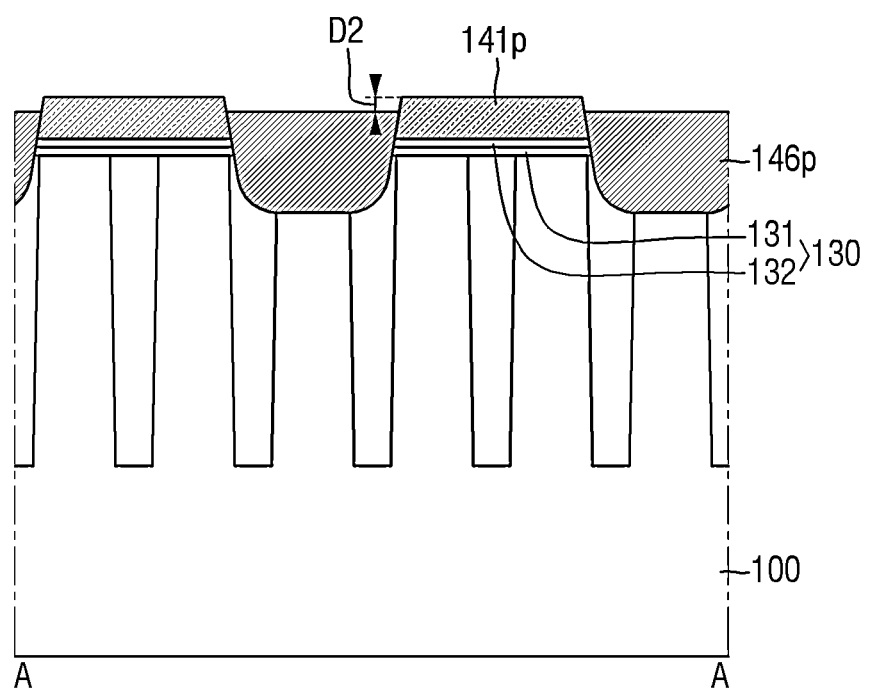
Figure 14B:
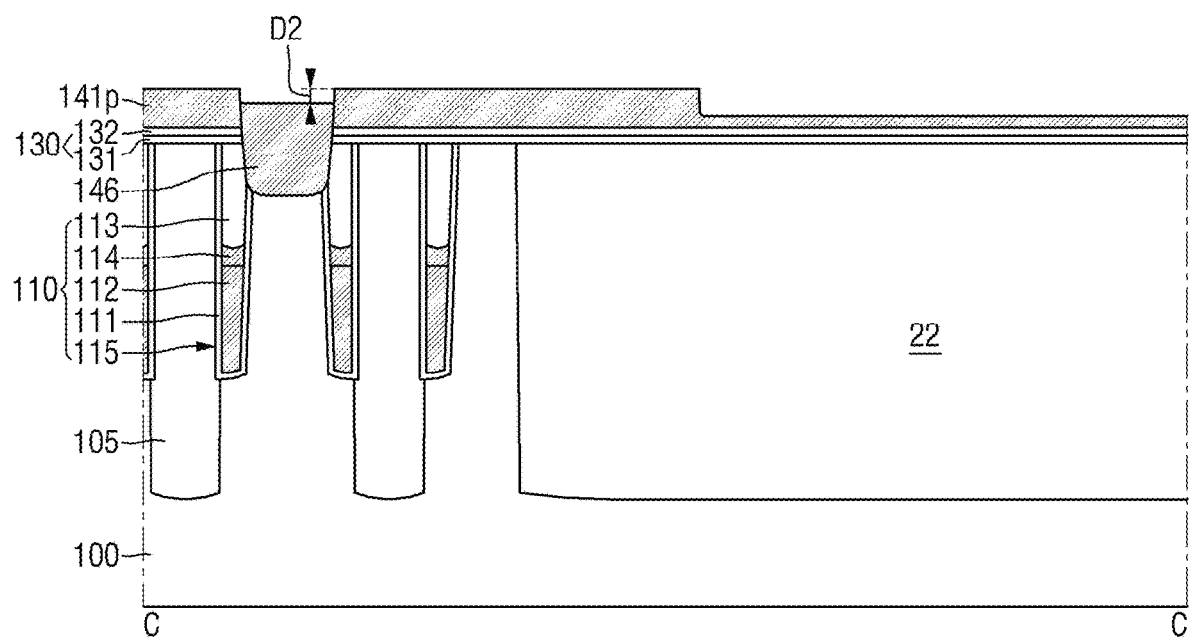

Referring to FIGS. 14a and 14b, a pre-bit line contact 146p may be formed between the pre-first cell conductive layer 141p and the substrate 100. The pre-bit line contact 146p may be disposed between a cell conductive layer structure 140p_ST, which will be described later, and the substrate 100.

Subsequently, the pre-bit line contact 146p may be removed, e.g. may be wet etched and/or dry etched, as much as second thickness D2 that is thinner than the first thickness D1. In this case, a mask may be formed on the pre-first cell conductive layer 141p in which the pre-bit line contact 146p is not formed, and the pre-bit line contact 146p may be removed as much as a predetermined thickness by using an etching process. Therefore, a height of an upper surface of the pre-bit line contact 146p may be leveled to be lower than that of an upper surface of the pre-first cell conductive layer 141p. For example, a step difference may be formed between the upper surface of the pre-bit line contact 146p and the upper surface of the pre-first cell conductive layer 141p.

Figure 15A:
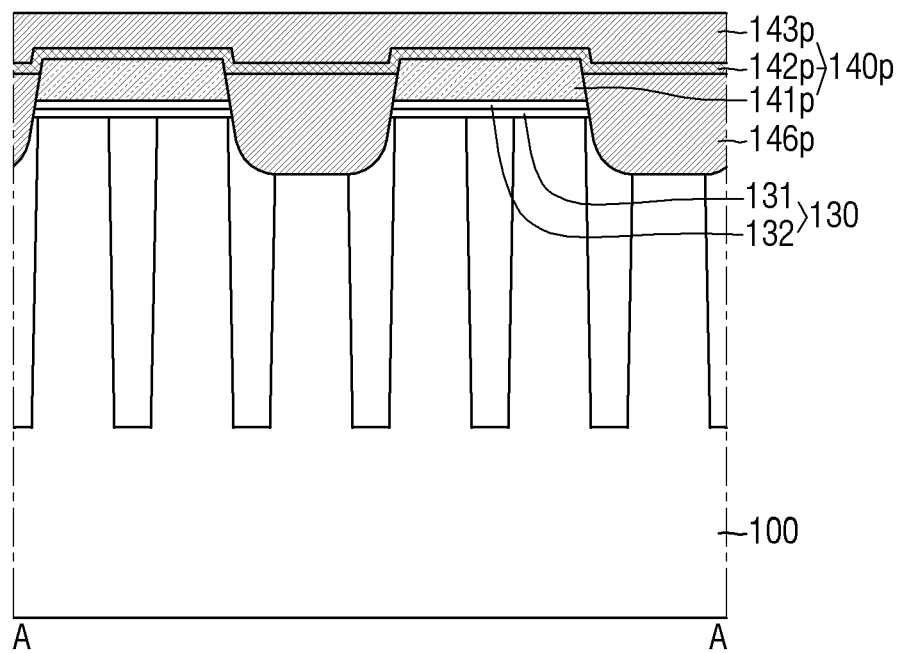
Figure 15B:
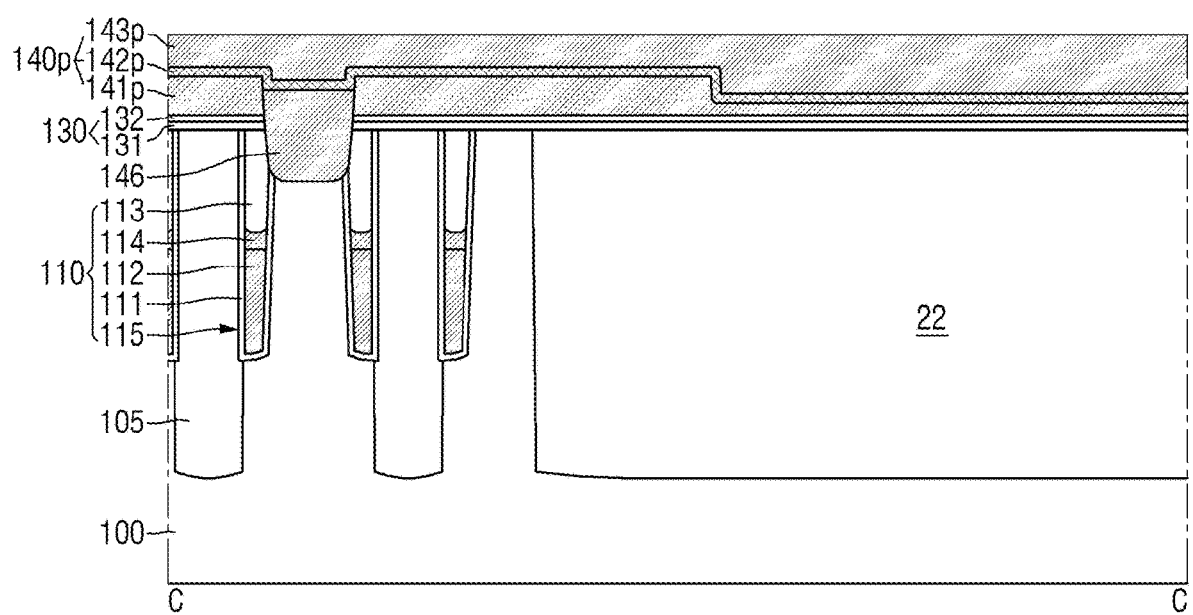
Figure 15C:
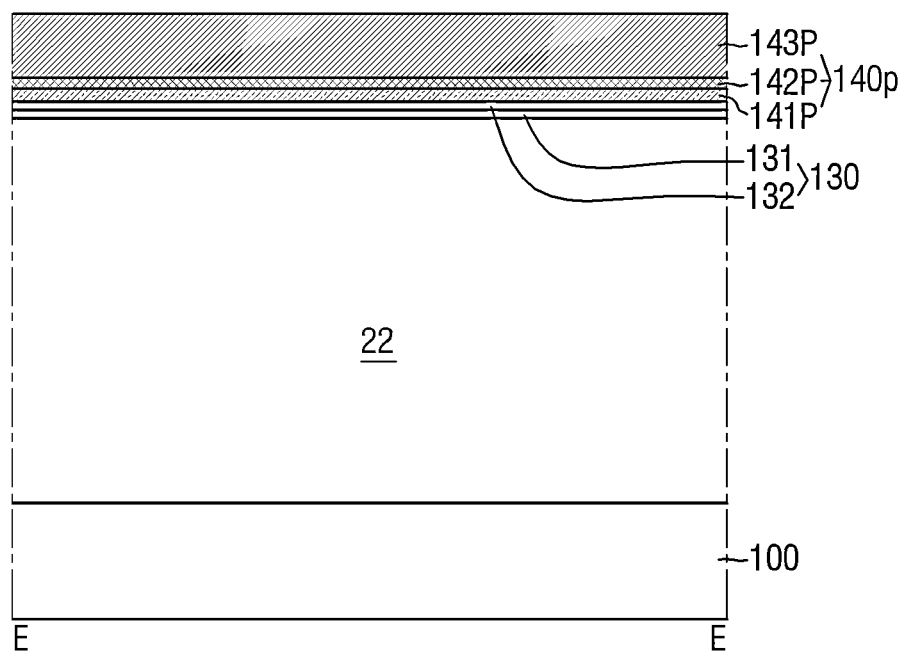

Referring to FIGS. 15a to 15c, a pre-cell conductive layer 140p, which includes a pre-first cell conductive layer 141p, a pre-second cell conductive layer 142p and a pre-third cell conductive layer 143p, may be formed on the substrate 100. The pre-second cell conductive layer 142p may be formed on the pre-first cell conductive layer 141p along a surface of the pre-first cell conductive layer 141p. Subsequently, the pre-third cell conductive layer 143p may be formed on the pre-second cell conductive layer 142p.

Then, an upper surface of the pre-third cell conductive layer 143p may be planarized using a chemical mechanical polishing (CMP) process and/or an etch-back process or the like.

Therefore, the pre-third cell conductive layer 143p may be formed to have a different thickness for each position on the cell region 20 and the cell region isolation layer 22. For example, a thickness of the pre-third cell conductive layer 143p on the cell region isolation layer 22 may be thicker than that of the pre-third cell conductive layer 143p on the cell region 20.

Alternatively or additionally, the pre-third cell conductive layer 143p may be formed to have different thicknesses on the cell region 20. For example, the thickness of the pre-third cell conductive layer 143p on the pre-bit line contact 146p may be thicker than that of the pre-third cell conductive layer 143p on the pre-first cell conductive layer 141p in which the pre-bit line contact 146p is not formed.

Figure 16A:
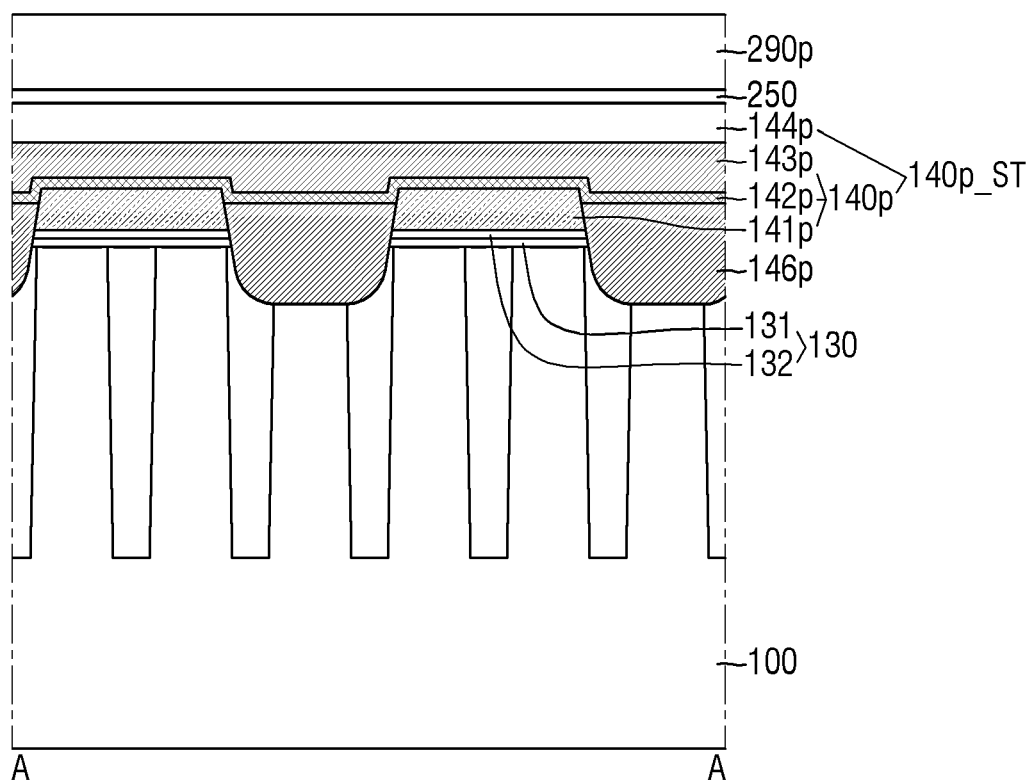
Figure 16B:
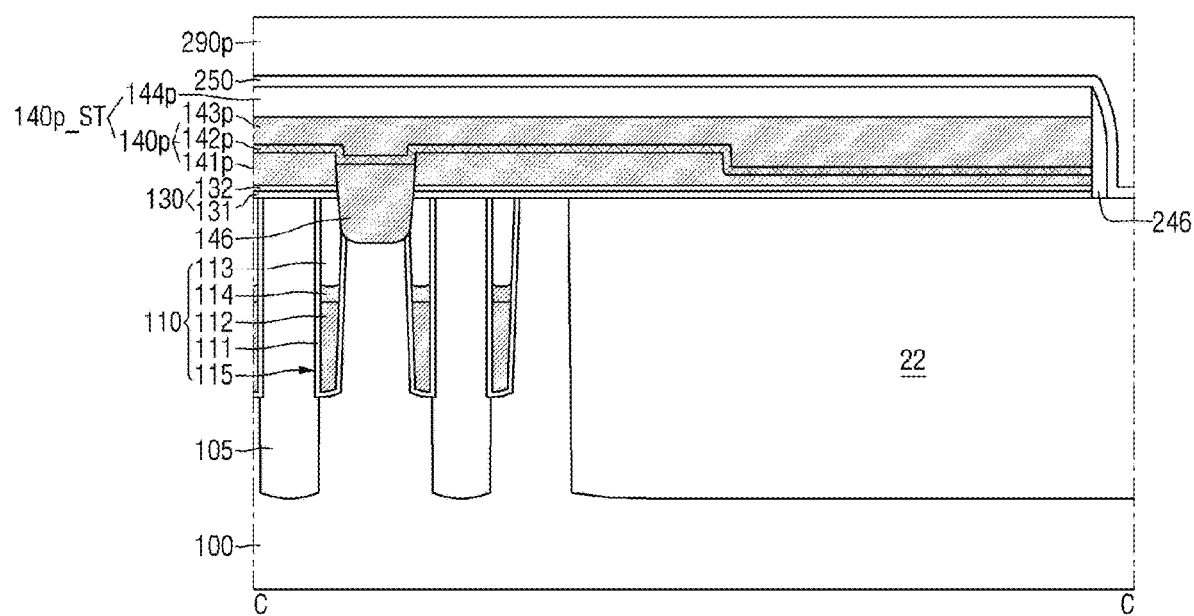
Figure 16C:
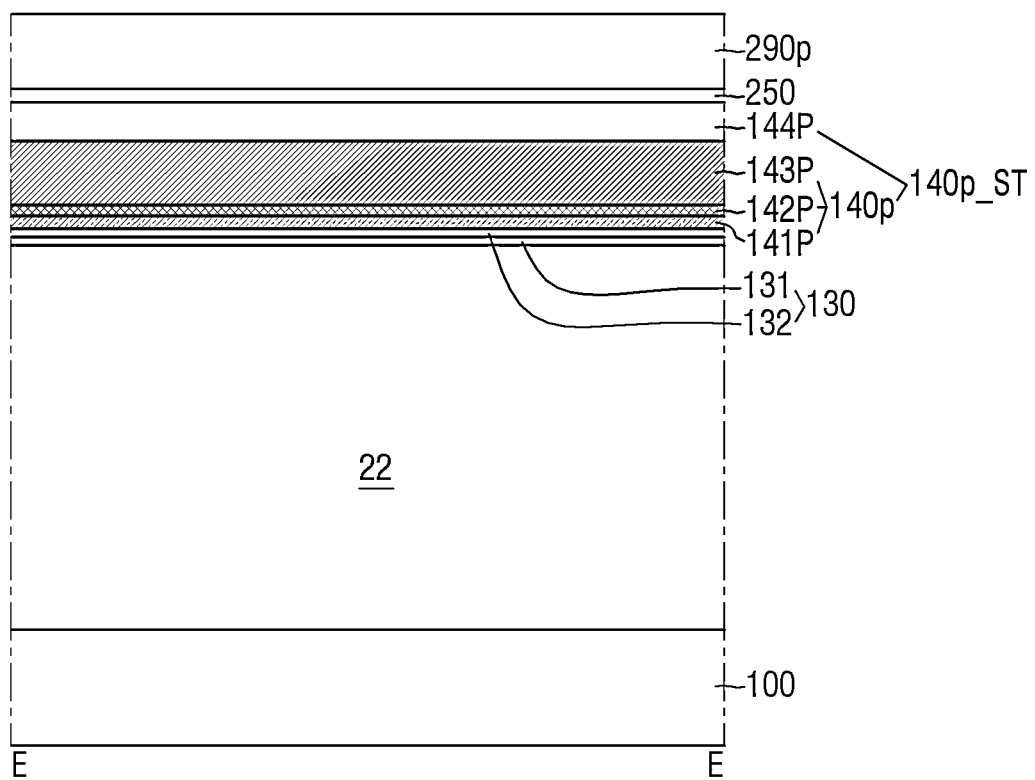

Referring to FIGS. 16a to 16c, a cell conductive layer structure 140p_ST may be formed on the substrate 100 of the cell region 20. The cell conductive layer structure 140p_ST may be formed on the cell insulating layer 130. The pre-bit line contact 146p may connect the cell conductive layer structure 140p_ST to the substrate 100.

The cell conductive layer structure 140p_ST may include a pre-cell conductive layer 140p and a lower cell capping layer 144p, which are sequentially stacked on the cell insulating layer 130. A cell boundary spacer 246 may be formed on a sidewall of the cell conductive layer structure 140p_ST.

Although not shown in detail, a peripheral gate structure 240ST may be formed on the substrate 100 of the peripheral region 24. As shown in FIG. 7, the peripheral gate structure 240ST may include a peripheral gate insulating layer 230, a peripheral gate conductive layer 240, a peripheral capping layer 244 and a peripheral spacer 245.

The cell conductive layer structure 140*p*_ST may be formed simultaneously with, e.g. fully or at least partly in the same process chamber as and at the same time as, the peripheral gate structure 240ST. The cell boundary spacer 246 may be formed simultaneously with, e.g. fully or at least partly in the same process chamber as and at the same time as, the peripheral spacer 245.

Then, a second etch stop layer 250 may be formed (e.g. deposited and/or spun) on the substrate 100. The second etch stop layer 250 may be formed on the cell conductive layer structure 140*p*_ST and the peripheral gate structure 240ST. The second etch stop layer 250 may be extended along a profile of the cell conductive layer structure 140*p*_ST and a profile of the peripheral gate structure 240ST.

Then, a first pre-interlayer insulating layer 290*p* may be formed on the second etch stop layer 250. The first pre-interlayer insulating layer 290*p* may entirely cover the second etch stop layer 250. The first pre-interlayer insulating layer 290*p* may include, for example, an oxide-based insulating material.

Figure 17A:
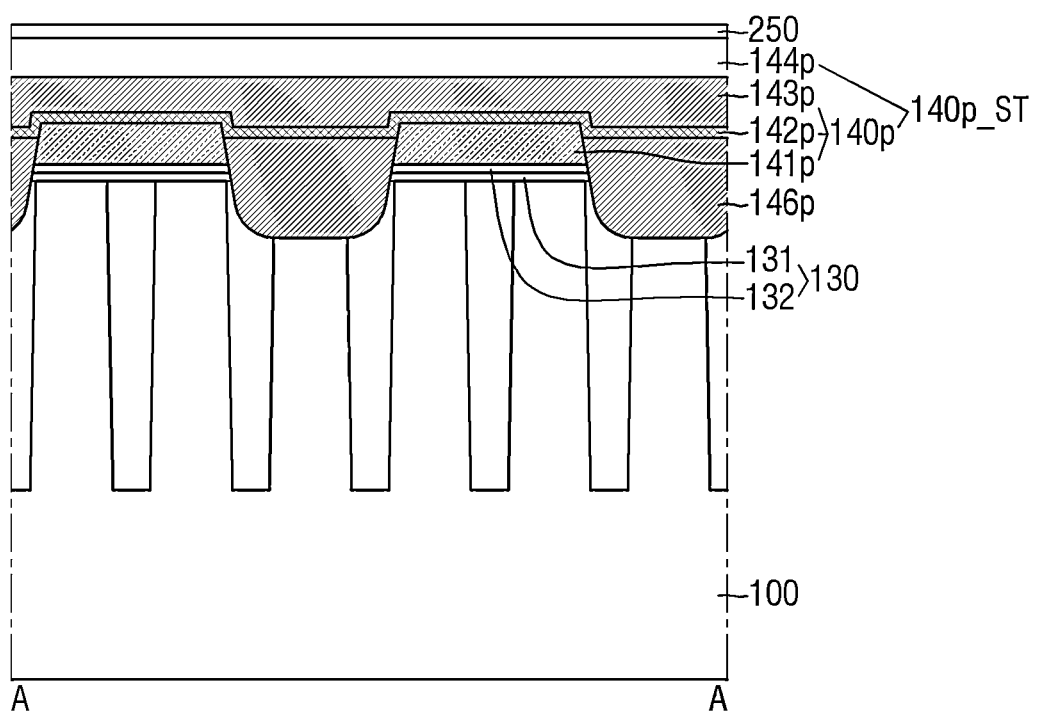
Figure 17B:
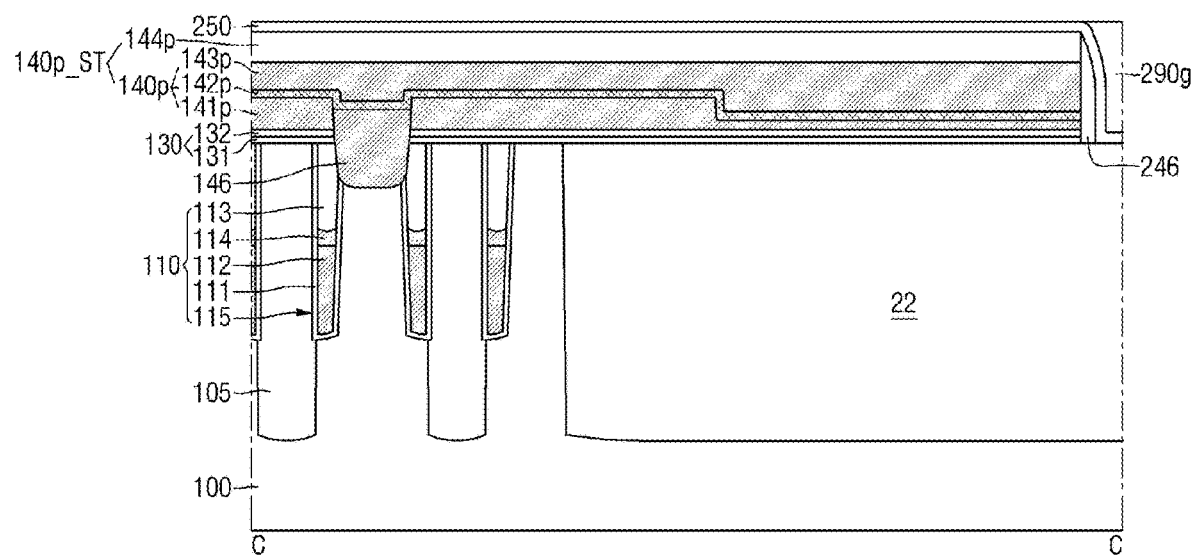
Figure 17C:
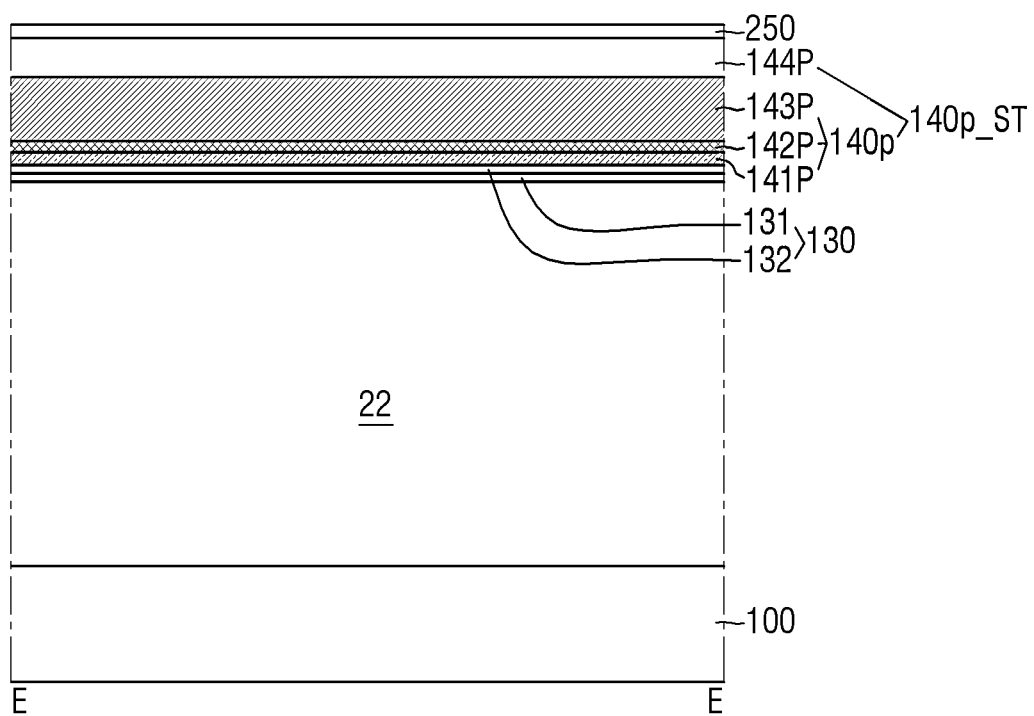

Referring to FIGS. 17*a* to 17*c*, a first pre-interlayer insulating layer 290*p* disposed on an upper surface of the second etch stop layer 250 on the cell conductive layer structure 140*p*_ST and the peripheral gate structure 240ST may be removed to form a second pre-interlayer insulating layer 290*g* on the second etch stop layer 250.

For example, the second pre-interlayer insulating layer 290*g* may be formed using a chemical mechanical polishing (CMP) process and/or an etch back process. That is, the first pre-interlayer insulating layer 290*p* on the cell conductive layer structure 140*p*_ST and the peripheral gate structure 240ST may be removed using a chemical mechanical polishing (CMP) process and/or an etch-back process.

Therefore, the second etch stop layer 250 on an upper surface of the cell conductive layer structure 140*p*_ST and an upper surface of the peripheral gate structure 240ST may be exposed.

Figure 18A:
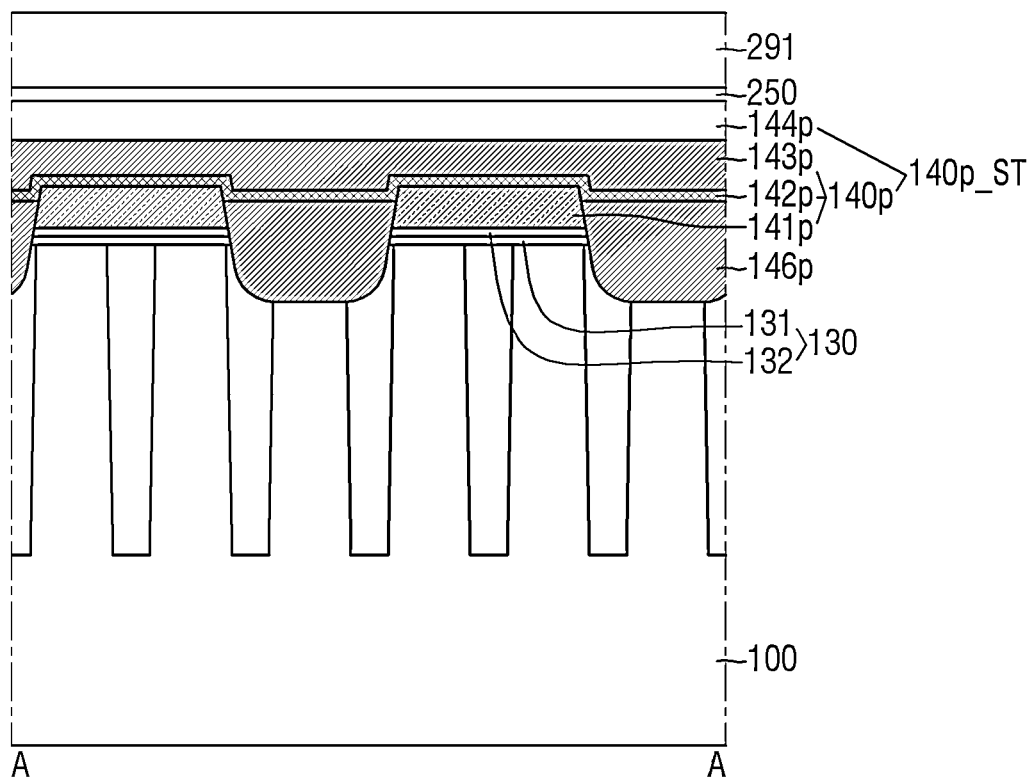
Figure 18B:
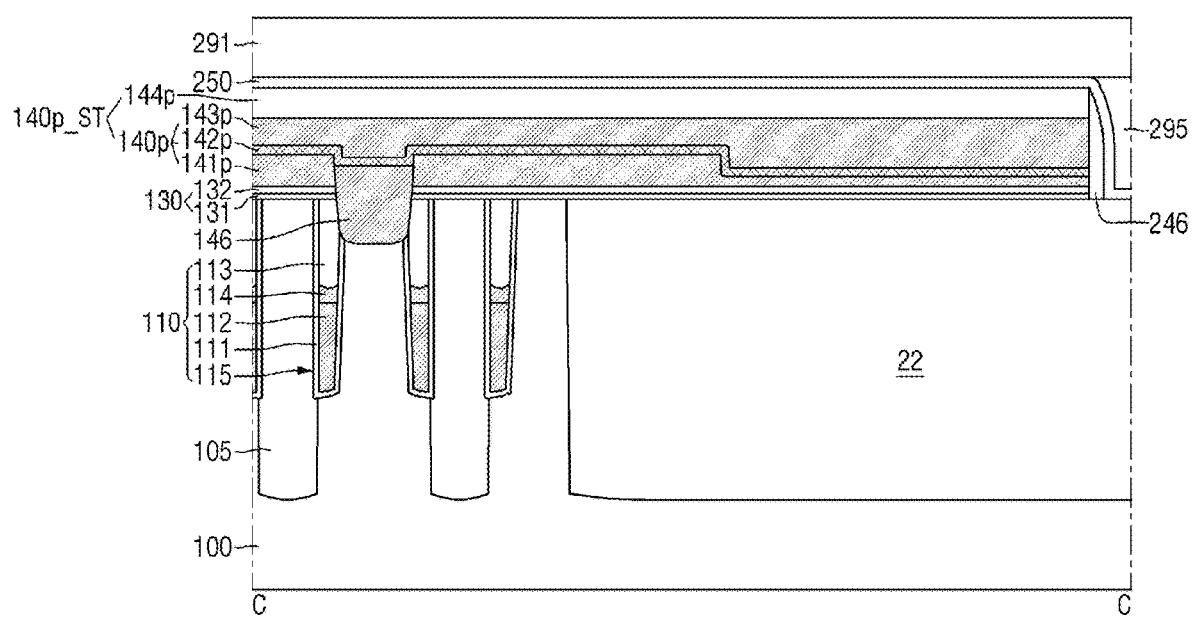

As a result, a cell interlayer insulating layer 295 of FIG. 18*b* may be formed on the second etch stop layer 250.

Unlike the shown example, a portion of the cell interlayer insulating layer 295 between the peripheral gate structure 240ST and the cell conductive layer structure 140*p*_ST may be further removed through an additional mask process.

Figure 18C:
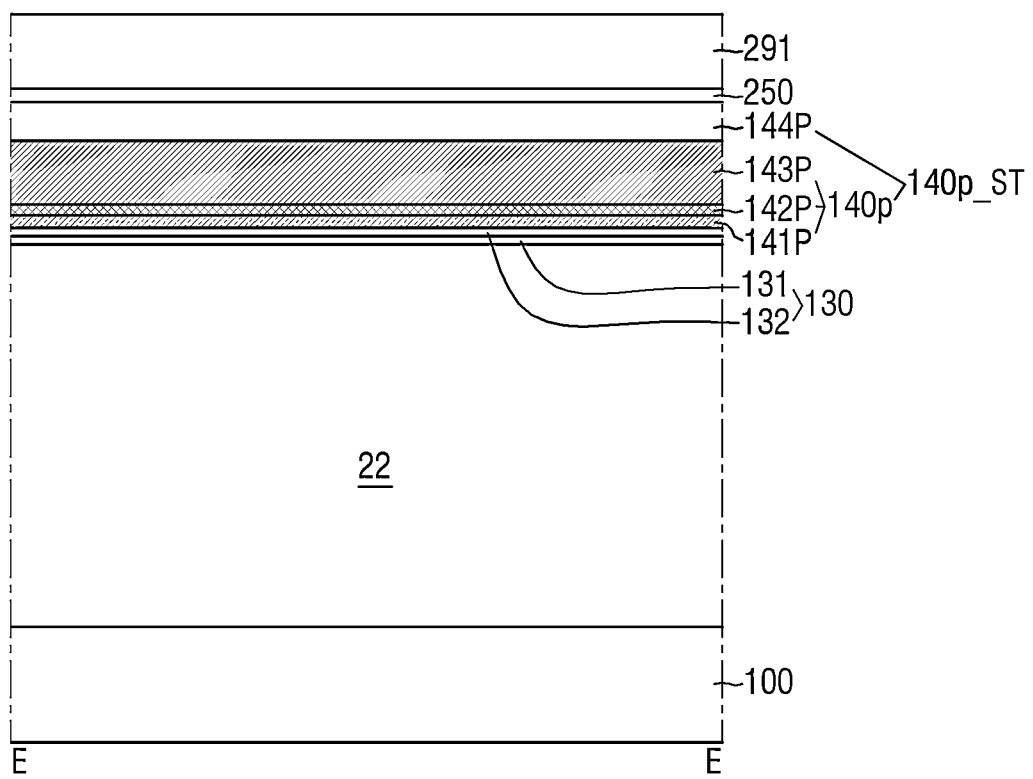

Referring to FIGS. 18*a* to 18*c*, an insertion interlayer insulating layer 291 may be formed on the cell interlayer insulating layer 295.

The insertion interlayer insulating layer 291 may be formed on the cell interlayer insulating layer 295 and the second etch stop layer 250 protruded above the cell interlayer insulating layer 295. The insertion interlayer insulating layer 291 may be formed on the cell region 20 as well as the peripheral region 24.

Figure 19A:
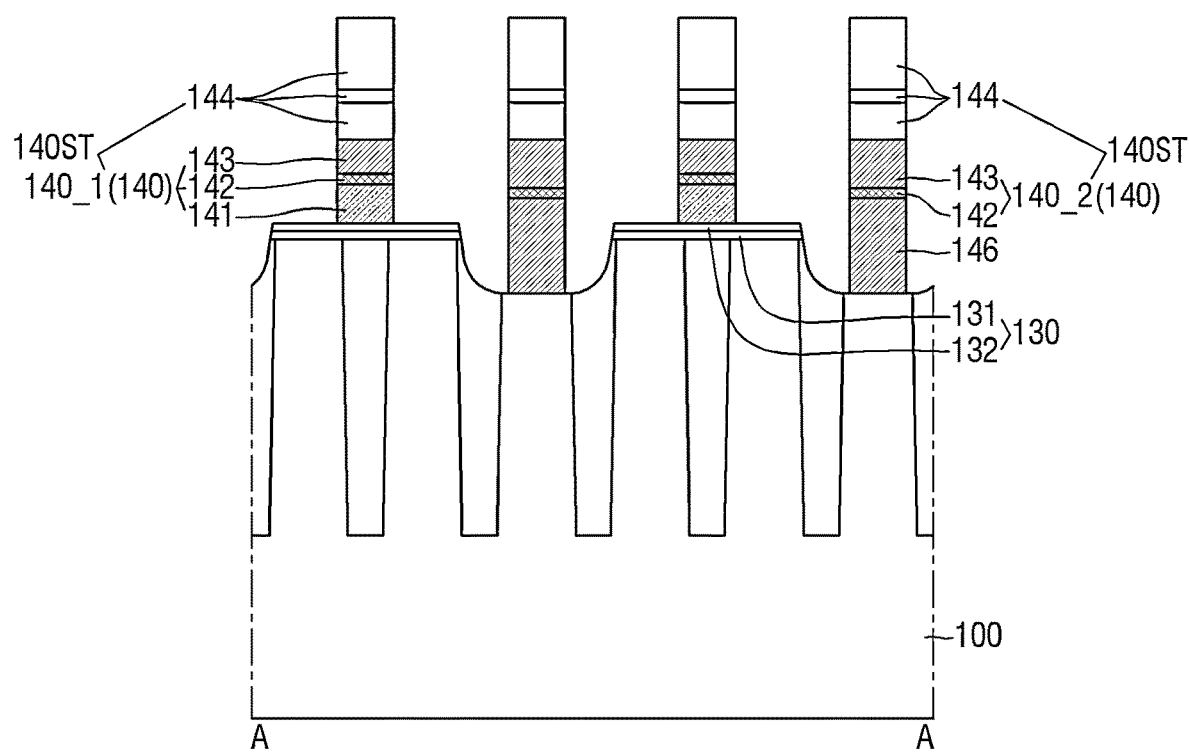
Figure 19B:
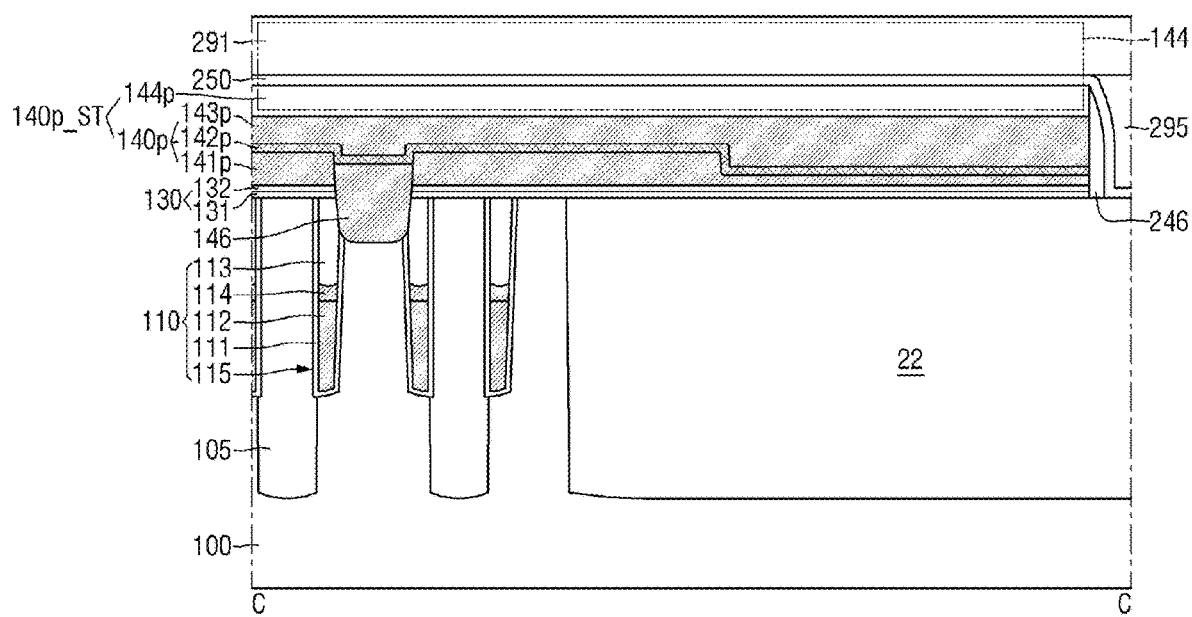
Figure 19C:
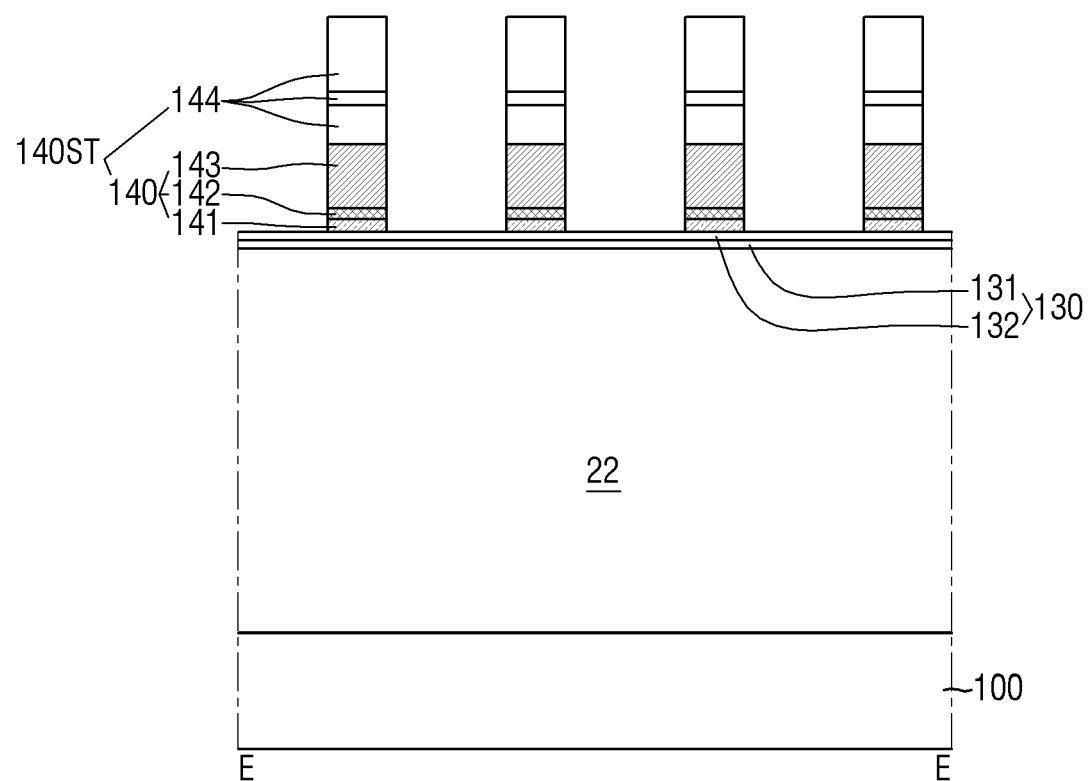

Referring to FIGS. 19*a* to 19*c*, a bit line structure 140ST may be formed by patterning the cell conductive layer structure 140*p*_ST and the insertion interlayer insulating layer 291 and the second etch stop layer 250 on the cell region 20.

A cell line capping layer 144 may include a patterned lower cell capping layer 144*p*, a patterned second etch stop layer 250, and a patterned insertion interlayer insulating layer 291.

A bit line contact 146 may be formed while the bit line structure 140ST is being formed.

Subsequently, a cell line spacer 150 may be formed. Then, a fence sacrificial insulating layer may be formed between bit line structures 140ST adjacent to each other in the first direction D1. The fence sacrificial insulating layer may be formed on an upper surface of the bit line structure 140ST and on spacers 154 and 154*e*. A fence pattern 170 may be formed on the cell gate structure 110 by patterning the fence sacrificial insulating layer.

After the fence pattern 170 is formed, a storage contact 120 may be formed between adjacent cell conductive lines 140 and between adjacent fence patterns 170.

In FIGS. 4 to 8, after the storage contact 120 is formed, a storage pad 160, a peripheral wiring line 265 and a bit line contact plug 261 may be formed.

Then, a first etch stop layer 292 may be formed. In addition, an information storage 190 may be formed.

Figure 20A:
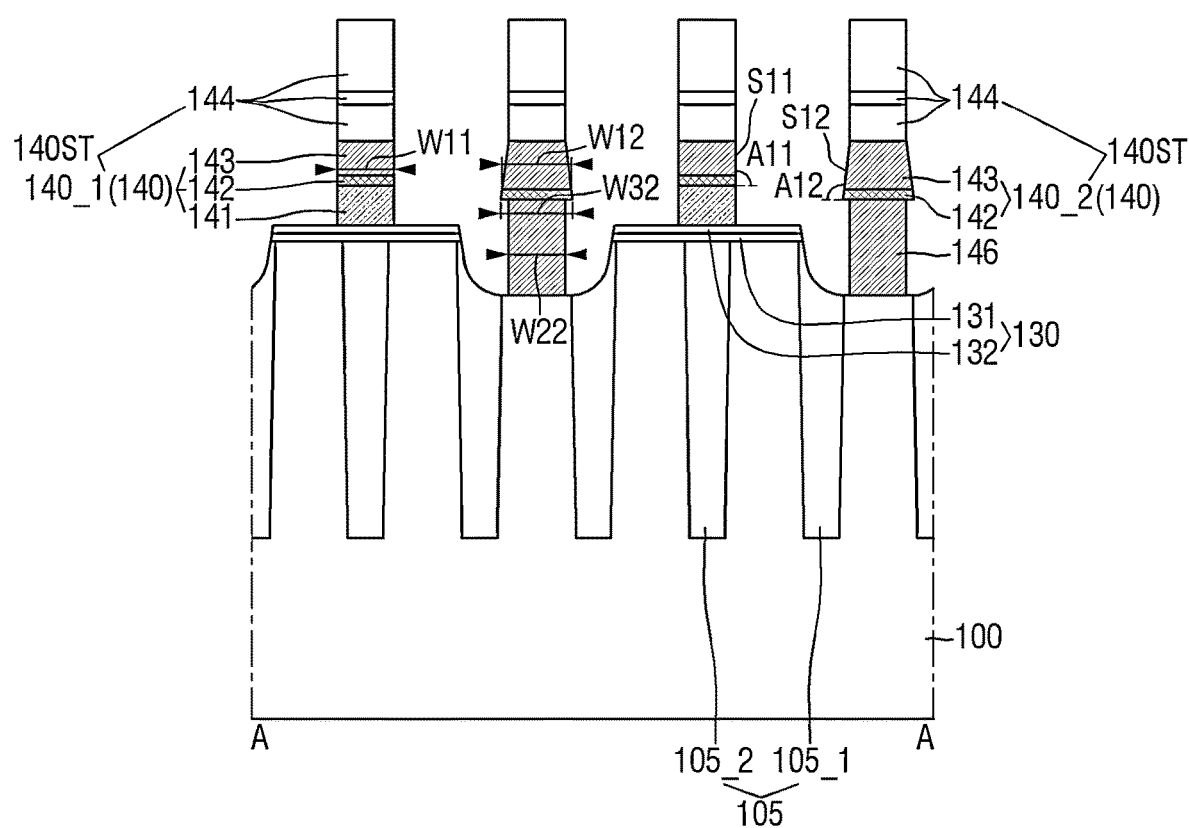
FIGS. 20a and 20b are views illustrating intermediate steps to describe a method of fabricating a semiconductor device according to some example embodiments.
Figure 20B:
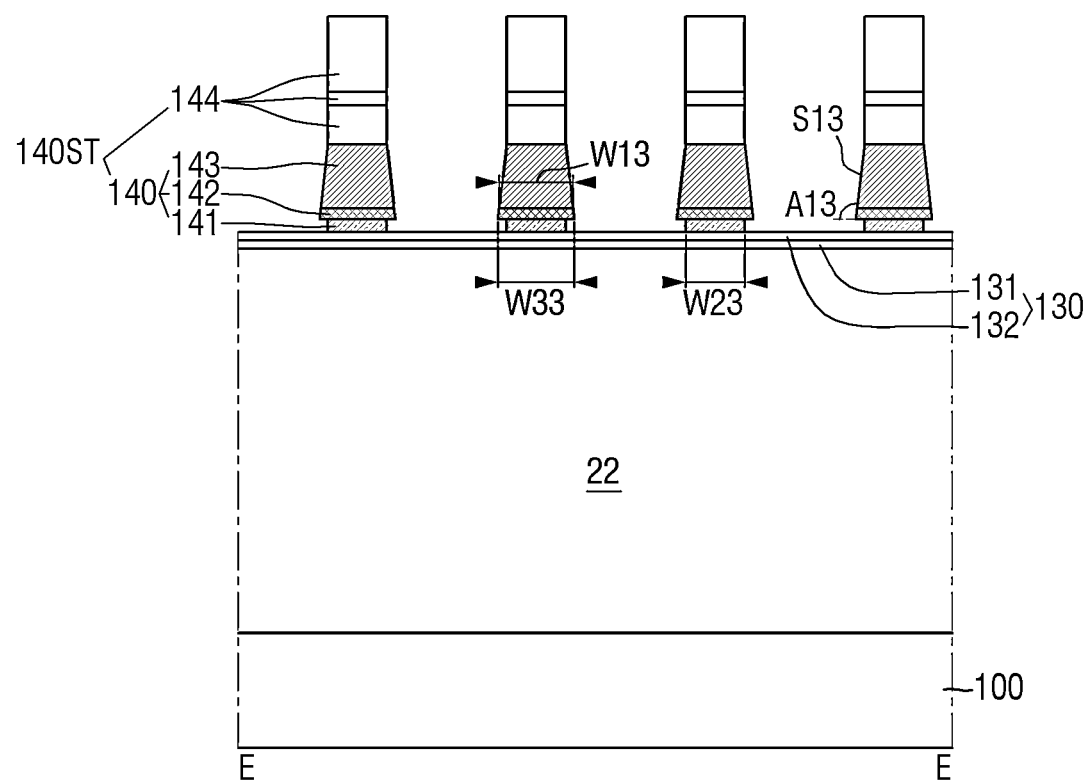

FIGS. 20*a* and 20*b* are views illustrating intermediate steps to describe a method of fabricating a semiconductor device according to some example embodiments. In the description related to the method of fabricating a semiconductor device, the description repeated with the description made with reference to FIGS. 11*a* to 19*c* will be briefly made or omitted.

Referring to FIGS. 20*a* and 20*b*, a length W13 along the first direction D1 of the third cell conductive layer 143 in the boundary region may be longer than a length W12 along the first direction D1 of the third cell conductive layer 143 on the bit line contact 146.

Referring to FIGS. 20*a* and 20*b*, the length W12 along the first direction D1 of the third cell conductive layer 143 on the bit line contact 146 may be longer than a length W11 along the first direction D1 of the third cell conductive layer 143 disposed on the first cell conductive layer 141 of the cell region 20.

A length W22 along the first direction D1 of the bit line contact 146 may be shorter than the length W12 along the first direction D1 of the third cell conductive layer 143 on the bit line contact 146.

The length W12 along the first direction D1 of the third cell conductive layer 143 on the bit line contact 146 may be increased toward the substrate 100, but is not limited thereto.

Also, in the boundary region, a length W23 along the first direction D1 of the first cell conductive layer 141 may be shorter than the length W13 along the first direction D1 of the third cell conductive layer 143.

The length W13 along the first direction D1 of the third cell conductive layer 143 may be increased toward the substrate 100, but is not limited thereto.

Referring to FIGS. 20*a* and 20*b*, a slope A12 of a sidewall S12 of the third cell conductive layer 143 of the first region 105_1, a slope A11 of a sidewall S11 of the third cell conductive layer 143 of the second region 105_2 and a slope A13 of a sidewall S13 of the third cell conductive layer 143 in the boundary region may be different from one another.

In detail, the slope A12 of the sidewall S12 of the third cell conductive layer 143 of the first region 105_1 may be greater than the slope A11 of the sidewall S11 of the third cell conductive layer 143 of the second region 105_2, and may be smaller than the slope A13 of the sidewall S13 of the third cell conductive layer 143 in the boundary region.

Referring to FIGS. 20*a* and 20*b*, a length W32 along the first direction D1 of the second cell conductive layer 142 on the bit line contact 146 may be longer than the length W22 along the first direction D1 of the bit line contact 146.

In addition, in the boundary region, a length W33 along the first direction D1 of the second cell conductive layer 142 may be longer than the length W23 along the first direction D1 of the first cell conductive layer 141.

Referring to FIGS. 20a and 20b, the slope A12 of the sidewall S12 of the second cell conductive layer 142 of the first region 105_1, the slope A11 of the sidewall S11 of the second cell conductive layer 142 of the second region 105_2 and the slope A13 of the sidewall S13 of the second cell conductive layer 142 in the boundary region may be different from one another.

In detail, the slope A12 of the sidewall S12 of the second cell conductive layer 142 of the first region 105_1 may be greater than the slope A11 of the sidewall S11 of the second cell conductive layer 142 of the second region 105_2 and may be smaller or less than the slope A13 of the sidewall S13 of the second cell conductive layer 142 in the boundary region.

The length along the first direction D1 of the second cell conductive layer 142 may be increased toward the substrate 100, but is not limited thereto.

Although various example embodiments have been described with reference to the accompanying drawings, it will be apparent to those of ordinary skill in the art that inventive concepts can be realized and/or fabricated in various forms without being limited to the above-described example embodiments and can be embodied in other specific forms without departing from the spirit and essential characteristics. Thus, the above example embodiments are to be considered in all respects as illustrative and not restrictive. Furthermore example embodiments are not necessarily mutually exclusive with one another. For example, some example embodiments may include one or more features described with reference to one or more figures, and may also include one or more features described with reference to one or more other figures.

What is claimed is:

1. A semiconductor memory device comprising:
a substrate including a cell region having an active region defined by a cell element isolation, a peripheral region near the cell region, and a boundary region between the cell region and the peripheral region;
a word line structure in the substrate and extending in a first direction;
a bit line structure on the substrate and extending from the cell region to the boundary region in a second direction that crosses the first direction, the bit line structure including first and second cell conductive layers sequentially stacked on the substrate; and
a bit line contact between the substrate and the bit line structure, the bit line contact connecting the substrate with the bit line structure,
wherein the second cell conductive layer in the boundary region is thicker than the second cell conductive layer in the cell region.

2. The semiconductor memory device of claim 1, wherein in the cell region, an upper surface of the bit line contact is below the first cell conductive layer.

3. The semiconductor memory device of claim 1, wherein in the cell region, the second cell conductive layer on the bit line contact is thicker than the second cell conductive layer on the first cell conductive layer.

4. The semiconductor memory device of claim 1, wherein along the first direction, the second cell conductive layer in the boundary region is longer than the second cell conductive layer on the bit line contact.

5. The semiconductor memory device of claim 1, wherein in the cell region, along the first direction the second cell conductive layer on the bit line contact is longer than the second cell conductive layer on the first cell conductive layer.

6. The semiconductor memory device of claim 1, wherein along the first direction, the bit line contact is shorter than the second cell conductive layer on the bit line contact.

7. The semiconductor memory device of claim 1, wherein, in the boundary region along the first direction, the first cell conductive layer is shorter than the second cell conductive layer.

8. The semiconductor memory device of claim 1, wherein
the cell element isolation includes a first region in which the bit line contact is present and a second region in which the bit line contact is not present, and
a slope of a sidewall of the second cell conductive layer on the first region, a slope of a sidewall of the second cell conductive layer on the second region, and a slope of a sidewall of the second cell conductive layer in the boundary region are different from one another.

9. The semiconductor memory device of claim 1, wherein the bit line structure further includes a third cell conductive layer between the first and second cell conductive layers.

10. The semiconductor memory device of claim 9, wherein along the first direction, the third cell conductive layer on the bit line contact is longer than the bit line contact.

11. The semiconductor memory device of claim 9, wherein, in the boundary region along the first direction, the third cell conductive layer is longer than the first cell conductive layer.

12. The semiconductor memory device of claim 9, wherein
the cell element isolation includes a first region in which the bit line contact is present and a second region in which the bit line contact is not present, and
a slope of a sidewall of the third cell conductive layer on the first region, a slope of a sidewall of the third cell conductive layer on the second region, and a slope of a sidewall of the third cell conductive layer in the boundary region are different from one another.

13. A semiconductor memory device comprising:
a substrate including a cell region having an active region defined by a cell element isolation layer, a peripheral region near the cell region, and a boundary region between the cell region and the peripheral region;
a word line structure in the substrate and extending in a first direction;
a bit line structure on the substrate and extending from the cell region to the boundary region in a second direction that crosses the first direction, the bit line structure including first and second cell conductive layers sequentially stacked in a direction away from the substrate; and
a bit line contact between the substrate and the bit line structure, and the bit line contact electrically connecting the substrate with the bit line structure,
wherein an upper surface of the first cell conductive layer in the boundary region is lower than an upper surface of the first cell conductive layer in the cell region, and
along the first direction, the second cell conductive layer in the boundary region is longer than the second cell conductive layer in the cell region.

14. The semiconductor memory device of claim 13, wherein an upper surface of the bit line contact is below the first cell conductive layer in the cell region and is above the first cell conductive layer in the boundary region.

15. The semiconductor memory device of claim 13, wherein along the first direction, the second cell conductive layer on the bit line contact is longer than the second cell conductive layer on the first cell conductive layer in the cell region and is shorter than the second cell conductive layer in the boundary region.

16. The semiconductor memory device of claim 13, wherein the second cell conductive layer on the bit line contact is thicker than the second cell conductive layer on the first cell conductive layer in the cell region and is thinner than the second cell conductive layer in the boundary region.

17. The semiconductor memory device of claim 13, wherein the first cell conductive layer in the boundary region is thinner than the first cell conductive layer in the cell region.

18. The semiconductor memory device of claim 13, wherein
the cell element isolation layer includes a first region in which the bit line contact is present and a second region in which the bit line contact is not present, and
a slope of a sidewall of the second cell conductive layer in the boundary region is greater than an upper surface of a sidewall of the second cell conductive layer on the first region.

19. A semiconductor memory device comprising:
a substrate including a cell region having an active region defined by a cell element isolation layer, a peripheral region near the cell region, and a boundary region between the cell region and the peripheral region;
a word line structure extending in the substrate in a first direction;
a bit line structure extending on the substrate from the cell region to the boundary region in a second direction that crosses the first direction, the bit line structure including first to third cell conductive layers sequentially stacked on the substrate; and
a bit line contact between the substrate and the bit line structure and electrically connecting the substrate with the bit line structure,
wherein an upper surface of the bit line contact is below the first cell conductive layer in the cell region and is higher than that of the first cell conductive layer in the boundary region, and
the third cell conductive layer on the bit line contact is thicker than the third cell conductive layer on the first cell conductive layer in the cell region and is thinner than the third cell conductive layer in the boundary region.

20. The semiconductor memory device of claim 19, wherein a slope of a sidewall of the third cell conductive layer on the bit line contact is greater than that of a sidewall of the third cell conductive layer on the first cell conductive layer and is less than that of a sidewall of the third cell conductive layer in the boundary region.

* * * * *